United States Patent
Zhu et al.

(10) Patent No.: US 11,508,743 B2
(45) Date of Patent: Nov. 22, 2022

(54) THREE-DIMENSIONAL MEMORY DEVICE HAVING MULTI-DECK STRUCTURE AND METHODS FOR FORMING THE SAME

(71) Applicant: YANGTZE MEMORY TECHNOLOGIES CO., LTD., Wuhan (CN)

(72) Inventors: Hongbin Zhu, Wuhan (CN); Juan Tang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/727,857

(22) Filed: Dec. 26, 2019

(65) Prior Publication Data
US 2021/0091103 A1 Mar. 25, 2021

Related U.S. Application Data

(63) Continuation of application No. PCT/CN2019/106960, filed on Sep. 20, 2019.

(51) Int. Cl.
*H01L 27/11556* (2017.01)
*H01L 21/768* (2006.01)
(Continued)

(52) U.S. Cl.
CPC .. *H01L 27/11556* (2013.01); *H01L 21/76816* (2013.01); *H01L 23/5226* (2013.01); *H01L 25/0657* (2013.01); *H01L 27/11582* (2013.01)

(58) Field of Classification Search
CPC ........ H01L 27/11575; H01L 27/11556; H01L 27/11582; H01L 23/5226; H01L 21/76816
See application file for complete search history.

(56) References Cited

U.S. PATENT DOCUMENTS 9,449,987 B1 9/2016 Miyata et al.
10,347,654 B1 * 7/2019 Iwai ................. H01L 27/11519
(Continued)

FOREIGN PATENT DOCUMENTS

CN 103681687 A 3/2014
CN 106887435 A 6/2017
(Continued)

OTHER PUBLICATIONS

International Search Report issued in corresponding International Application No. PCT/CN2019/106960, dated Jun. 23, 2020, 4 pages.

(Continued)

*Primary Examiner* — Sarah K Salerno
(74) *Attorney, Agent, or Firm* — Bayes PPLLC

(57) ABSTRACT

Embodiments of structure and methods for forming a three-dimensional (3D) memory device are provided. In an example, a 3D memory device includes a substrate and a stack structure in an insulating structure on the substrate. The stack structure includes alternating a plurality of conductor layers and a plurality of insulating layers. The 3D memory device further includes a source structure extending vertically through the alternating stack structure. The source structure includes at least one staggered portion along a respective sidewall. The 3D memory device further includes a channel structure and a support pillar each extending vertically through the alternating stack structure and a plurality of contact structures extending vertically through the insulating structure.

15 Claims, 15 Drawing Sheets

(51) Int. Cl.
  *H01L 23/522* (2006.01)
  *H01L 25/065* (2006.01)
  *H01L 27/11582* (2017.01)

(56) References Cited

U.S. PATENT DOCUMENTS

| | | | |
|---|---|---|---|
| 2015/0236038 A1* | 8/2015 | Pachamuthu | H01L 27/11524 257/326 |
| 2016/0104715 A1 | 4/2016 | Pachamuthu et al. | |
| 2017/0236746 A1* | 8/2017 | Yu | H01L 27/11582 257/314 |
| 2018/0197876 A1 | 7/2018 | Ge et al. | |
| 2018/0240811 A1 | 8/2018 | Kim et al. | |
| 2019/0067314 A1* | 2/2019 | Lu | H01L 27/11565 |
| 2019/0081060 A1 | 3/2019 | Lu et al. | |
| 2019/0279996 A1* | 9/2019 | Yamashita | H01L 21/76816 |
| 2020/0105784 A1* | 4/2020 | Jang | H01L 29/4234 |
| 2020/0194450 A1 | 6/2020 | Pachamuthu et al. | |
| 2020/0402992 A1 | 12/2020 | Otsu et al. | |

FOREIGN PATENT DOCUMENTS

| | | |
|---|---|---|
| CN | 107771356 A | 3/2018 |
| CN | 107810552 A | 3/2018 |
| CN | 108461502 A | 8/2018 |
| CN | 108766971 A | 11/2018 |
| CN | 109075174 A | 12/2018 |
| CN | 109075175 A | 12/2018 |
| CN | 109314114 A | 2/2019 |
| CN | 109417075 A | 3/2019 |
| CN | 109473433 A | 3/2019 |
| CN | 109712987 A | 5/2019 |
| CN | 109904171 A | 6/2019 |
| CN | 110088906 A | 8/2019 |
| TW | 201834207 A | 9/2018 |

OTHER PUBLICATIONS

Written Opinion of the International Searching Authority issued in corresponding International Application No. PCT/CN2019/106960, dated Jun. 23, 2020, 4 pages.

International Search Report issued in corresponding International Application No. PCT/CN2019/106947, dated Jun. 28, 2020, 4 pages.

Written Opinion of the International Searching Authority issued in corresponding International Application No. PCT/CN2019/106947, dated Jun. 28, 2020, 4 pages.

* cited by examiner

THREE-DIMENSIONAL MEMORY DEVICE HAVING MULTI-DECK STRUCTURE AND METHODS FOR FORMING THE SAME

CROSS-REFERENCE TO RELATED APPLICATIONS

This application is continuation of International Application No. PCT/CN2019/106960, filed on Sep. 20, 2019, entitled "THREE-DIMENSIONAL MEMORY DEVICE HAVING MULTI-DECK STRUCTURE AND METHODS FOR FORMING THE SAME," which is hereby incorporated by reference in its entirety. This application is also related to U.S. application Ser. No. 16/727,856, filed on Dec. 26, 2019, entitled "THREE-DIMENSIONAL MEMORY DEVICE HAVING MULTI-DECK STRUCTURE AND METHODS FOR FORMING THE SAME," which is hereby incorporated by reference in its entirety.

BACKGROUND

Embodiments of the present disclosure relate to three-dimensional (3D) memory devices and methods for forming the 3D memory devices.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array.

SUMMARY

Embodiments of 3D memory devices with multi-deck structures and methods for forming the 3D memory devices are provided.

In one example, a 3D memory device includes a substrate and a stack structure in an insulating structure on the substrate. The stack structure includes alternating a plurality of conductor layers and a plurality of insulating layers. The 3D memory device further includes a source structure extending vertically through the alternating stack structure. The source structure includes at least one staggered portion along a respective sidewall. The 3D memory device further includes a channel structure and a support pillar each extending vertically through the alternating stack structure and a plurality of contact structures extending vertically through the insulating structure.

In another example, a method for forming a 3D memory device includes the following operations. First, on a substrate, a first dielectric deck is formed in an insulating portion. The first dielectric deck has a plurality of dielectric layer pairs, each of the plurality of dielectric layer pairs having a first dielectric layer and a second dielectric layer different from the first dielectric layer. A first pillar hole portion and a first slit opening portion are formed each extending vertically through the first dielectric deck. A pillar-sacrificial portion and a slit-sacrificial portion are formed respectively in the first pillar hole portion and the first slit opening portion. On the first dielectric deck, a second dielectric deck is formed in another insulating portion. The second dielectric deck has another plurality of dielectric layer pairs, each of the other plurality of dielectric layer pairs having another first dielectric layer and another second dielectric layer different from the other first dielectric layer. A second pillar hole portion and a second slit opening portion are formed each extending vertically through the second dielectric deck. The second pillar hole portion exposes the pillar-sacrificial portion and the second slit opening portion exposes the slit-sacrificial portion. Further, the pillar-sacrificial portion is removed, the second pillar hole portion and the first pillar hole portion forming a pillar hole. A support pillar is formed in the pillar hole. The slit-sacrificial portion is removed, the first slit opening portion and the second slit opening portion forming a slit opening. Further, a source structure is formed in the slit opening.

In a further example, a method for forming a 3D memory device includes the following operations. First, on a substrate, a first dielectric deck is formed in an insulating portion, the first dielectric deck having a plurality of dielectric layer pairs, each of the plurality of dielectric layer pairs having a first dielectric layer and a second dielectric layer different from the first dielectric layer. A first slit opening portion is formed extending vertically through the first dielectric deck, and a first contact opening portion is formed extending through the insulating portion. A slit-sacrificial portion is then formed in the first slit opening portion and a contact portion is then formed in the first contact opening portion. Further, on the first dielectric deck, a second dielectric deck is formed in another insulating portion. The second dielectric deck include another plurality of dielectric layer pairs, each of the other plurality of dielectric layer pairs having another first dielectric layer and another second dielectric layer different from the other first dielectric layer. A second slit opening portion is then formed extending vertically through the second dielectric deck and a second contact opening portion is then formed extending through the other insulating portion. The second slit opening portion exposes the slit-sacrificial portion and the second contact opening portion exposes the contact portion. The slit-sacrificial portion is then removed. The first slit opening portion and the second slit opening portion form a slit opening. A source structure is then formed in the slit opening.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
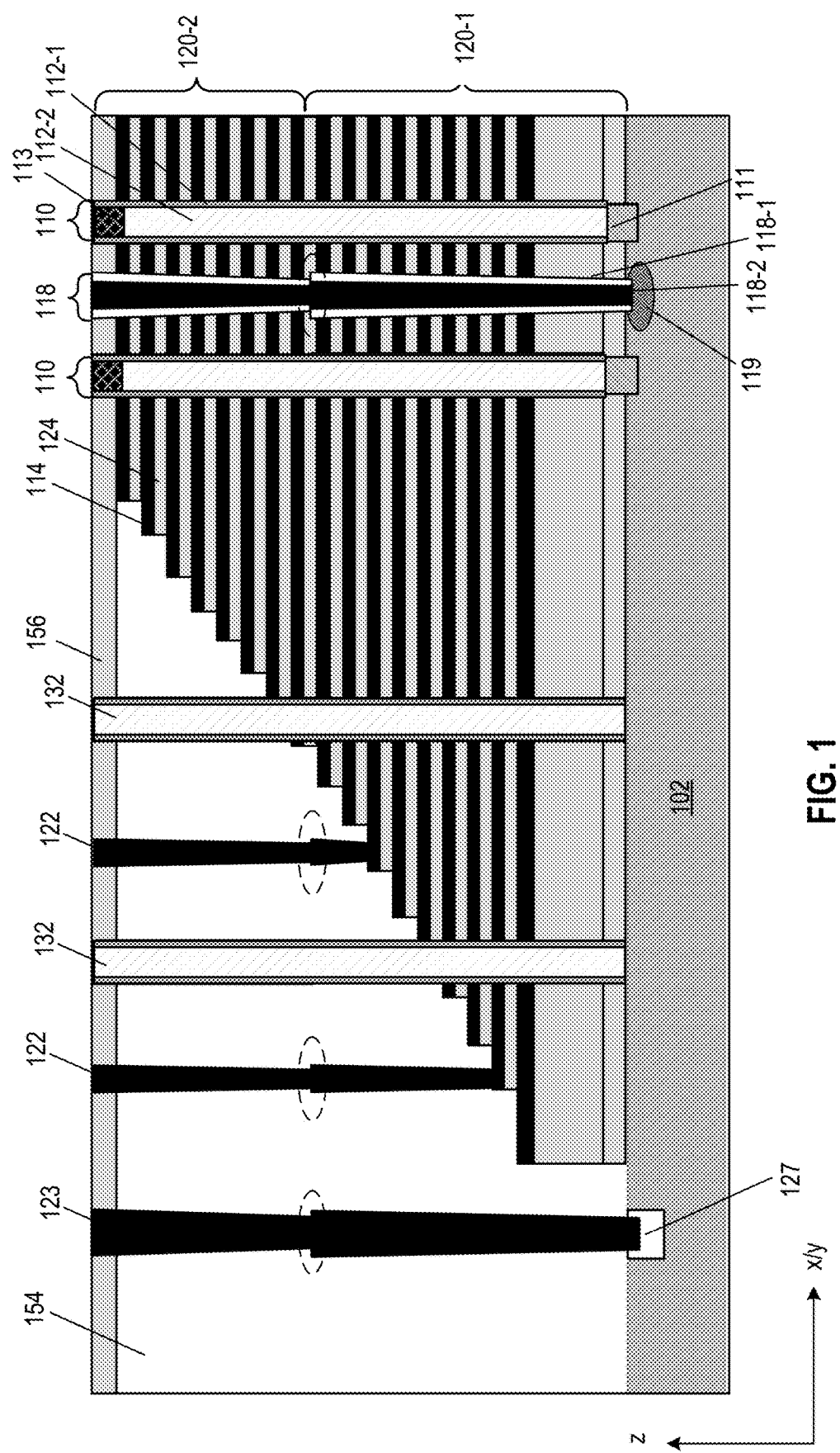
FIG. 1 illustrates a cross-sectional view of an exemplary 3D memory device having a multi-deck structure, according to some embodiments of the present disclosure.

Embodiments of the present disclosure will be described with reference to the accompanying drawings.

DETAILED DESCRIPTION

Although specific configurations and arrangements are discussed, this should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. A "step" or "stair" refers to a vertical shift in the height of a set of adjoined surfaces. In the present disclosure, the term "stair" and the term "step" refer to one level of a staircase structure and are used interchangeably. In the present disclosure, a horizontal direction can refer to a direction (e.g., the x-axis or the y-axis) parallel with the top surface of the substrate (e.g., the substrate that provides the fabrication platform for formation of structures over it), and a vertical direction can refer to a direction (e.g., the z-axis) perpendicular to the top surface of the structure.

NAND flash memory devices, widely used in various electronic produces, are non-volatile, light-weighted, of low power consumption and good performance. Currently, planar NAND flash memory devices have reached its storage limit. To further increase the storage capacity and reduce the storage cost per bit, 3D NAND memory devices have been proposed. An existing 3D NAND memory device often includes a plurality of memory blocks. Adjacent memory blocks are often separated by a gate line slit (GLS), in which an array common source (ACS) is formed. In the fabrication method to form existing 3D NAND memory devices, GLSs are often formed by etching through the entire stack of conductor/dielectric layer pairs.

As the demand for higher memory capacity continues, 3D NAND memory devices with multi-deck structures have been proposed. Compared to existing 3D NAND memory devices, 3D NAND memory devices with multi-deck structures often have more levels (or conductor/dielectric layer pairs) along the vertical direction. Due to an increased number of levels, the existing etching method to form GLSs become challenging. For example, GLSs with undesirably high aspect ratios can be formed. The device material may also be difficult to fully remove due to a higher number of conductor/dielectric layer pairs along the vertical direction. The performance of the 3D NAND memory device can be affected.

The present disclosure provides a 3D memory device (e.g., 3D NAND memory device) having a multi-deck structure and methods for forming the 3D memory device. The 3D memory device has a slit opening (e.g., a GLS) extending vertically in the 3D memory device. A source structure (e.g., an ACS) is formed in the slit opening. The 3D memory device can be formed by sequentially depositing a plurality of dielectric decks, and the slit opening can be formed by forming slit opening portions in each dielectric deck and jointly connecting the slit opening portions. The source structure can then be formed in the slit opening. A staggered portion can be formed between slit opening portions, e.g., at the interface of adjacent decks and along the sidewall of the slit opening. The formation of the slit opening and the source structure may thus be less impacted by the number of levels along the vertical direction.

In the present disclosure, other structures can also be formed by the same etching processes that forms the slit opening, e.g., to reduce the fabrication steps and/or the number of patterning masks. In some embodiments, channel holes, for forming channel structures, are formed by the same etching processes that form the slit opening. In some embodiments, contact openings for forming staircase contact structures and peripheral contact structure and pillar holes for forming support pillars are formed by the same etching processes that form the slit opening. Respective sacrificial structures may be formed and removed at desired fabrication stages in the slit openings, the channel holes, and the pillar holes for the formation of the contact structures, the support pillars, the source structures, and the channel structures. To further reduce the fabrication steps, conductive materials are used for the formation of the sacrificial structures so that the contact structures can be formed without forming any sacrificial structures in the contact openings. The fabrication of the 3D memory device can be improved.

FIG. 1 illustrates a cross-sectional view of an exemplary 3D memory device 100 with a multi-deck structure, according to some embodiments. As shown in FIG. 1, 3D memory device 100 may include a substrate 102, an insulating structure 154 over substrate 102, and a stack structure 120 in insulating structure 154. Stack structure 120 may be a stack structure that includes a first memory deck 120-1 and a second memory deck 120-2. Stack structure 120 may optionally include a dielectric cap layer 156 covering second memory deck 120-2. Stack structure 120 may include alternating a plurality of conductor layers 114 and a plurality of dielectric layers 124. 3D memory device 100 may include a plurality of contact structures extending vertically in insulating structure 154. The contact structures may include one or more staircase contact structures 122 and one or more peripheral contact structures 123. 3D memory device 100 may also include a plurality of channel structures 110, one or more source structures 118 (e.g., array common sources or ACSs), and one or more support pillars 132 (also referred to as dummy channels), formed and extending vertically in stack structure 120. The detailed descriptions of the structures are provided as follows.

Substrate 102 can include silicon (e.g., single crystalline silicon), silicon germanium (SiGe), gallium arsenide (GaAs), germanium (Ge), silicon on insulator (SDI), germanium on insulator (GOI), or any other suitable materials. In some embodiments, substrate 102 is a thinned substrate (e.g., a semiconductor layer), which was thinned by grinding, etching, chemical mechanical polishing (CMP), or any combination thereof. In some embodiments, substrate 102 includes silicon.

Insulating structure 154 may include any suitable dielectric material that surrounds and insulates stack structure 120 from other structures/devices. For example, insulating structure 154 includes silicon oxide, silicon nitride, and/or silicon oxynitride. In some embodiments, insulating structure 154 includes silicon oxide. Dielectric cap layer 156 may include any suitable dielectric layer such as silicon oxide.

Stack structure 120 may include a plurality of conductor layer 114 and dielectric layer 124 pairs. The intersection of channel structures 110 and conductor layers 114 may form a plurality of memory cells. The plurality of conductor/dielectric layer pairs are also referred to as an "alternating conductor/dielectric stack." The number of the conductor/dielectric layer pairs in stack structure 120 (e.g., 32, 64, 96, or 128) determines the number of memory cells in 3D memory device 100. Conductor layers 114 and dielectric layers 124 in the alternating conductor/dielectric stack alternate in the vertical direction (e.g., the z-direction). In other words, except for the ones at the top or bottom of the alternating conductor/dielectric stack, each conductor layer 114 can be adjoined by two dielectric layers 124 on both sides, and each dielectric layer 124 can be adjoined by two conductor layers 114 on both sides. Conductor layers 114 can each have the same thickness or have different thicknesses. Similarly, dielectric layers 124 can each have the same thickness or have different thicknesses. Conductor layers 114 can include conductor materials including, but not limited to, tungsten (W), cobalt (Co), copper (Cu), aluminum (Al), polycrystalline silicon (polysilicon), doped silicon, silicides, or any combination thereof. Dielectric layers 124 can include dielectric materials including, but not limited to, silicon oxide, silicon nitride, silicon oxynitride, or any combination thereof. In some embodiments, conductor layers 114 include metal layers, such as W, and dielectric layers 124 include silicon oxide.

Channel structures 110 may form an array and may each extend vertically above substrate 102. Channel structure 110 can include a semiconductor channel extending vertically through the alternating conductor/dielectric stack. The semiconductor channel can include a channel hole filled with a channel-forming structure of a plurality of channel-forming layers, e.g., dielectric materials (e.g., as a memory film) and semiconductor materials (e.g., as a semiconductor layer). In some embodiments, the memory film is a composite layer including a tunneling layer, a memory layer (also known as a "charge trap layer"), and a blocking layer. For ease of illustration, the memory film and the semiconductor layer are together depicted as element 112-1. The remaining space of the channel hole of semiconductor channel can be partially or fully filled with a dielectric core 112-2 including dielectric materials, such as silicon oxide. The semiconductor channel can have a cylinder shape (e.g., a pillar shape) through stack structure 120 or have a staggered portion at the interface between adjacent decks (e.g., between first memory deck 120-1 and second memory deck 120-2 and along the sidewall of channel structure 110). The dielectric core, semiconductor layer, the tunneling layer, the memory layer, and the blocking layer are arranged radially from the center toward the outer surface of the pillar in this order, according to some embodiments. The semiconductor layer can include silicon, such as amorphous silicon, polysilicon, and/or single crystalline silicon. The tunneling layer can include silicon oxide, silicon oxynitride, or any combination thereof. The memory layer can include silicon nitride, silicon oxynitride, silicon, or any combination thereof. The blocking layer can include silicon oxide, silicon oxynitride, high dielectric constant (high-k) dielectrics, or any combination thereof. In one example, the memory layer can include a composite layer of silicon oxide/silicon oxynitride (or silicon nitride)/silicon oxide (ONO).

In some embodiments, channel structure 110 further includes a conductive plug 111 (e.g., a semiconductor plug) in the lower portion (e.g., at the lower end of bottom) of channel structure 110. As used herein, the "upper end" of a component (e.g., channel structure 110) is the end farther away from substrate 102 in the vertical direction, and the "lower end" of the component (e.g., channel structure 110) is the end closer to substrate 102 in the vertical direction when substrate 102 is positioned in the lowest plane of 3D memory device 100. Conductive plug 111 can include a semiconductor material, such as silicon, which is epitaxially grown from substrate 102 or deposited onto substrate 102 in any suitable directions. It is understood that in some embodiments, conductive plug 111 includes single crystalline silicon, the same material as substrate 102. In other words, conductive plug 111 can include an epitaxially-grown semiconductor layer grown from substrate 102. Conductive plug 111 can also include a different material than substrate 102. In some embodiments, conductive plug 111 includes at least one of silicon, germanium, and silicon germanium. In some embodiments, part of conductive plug 111 is above the top surface of substrate 102 and in contact with the semiconductor channel. Conductive plug 111 may be conductively connected to the semiconductor channel. In some embodiments, a top surface of conductive plug 111 is located between a top surface and a bottom surface of a bottom dielectric layer 124 (e.g., the dielectric layer at the bottom of stack structure 120).

In some embodiments, channel structure 110 further includes a drain structure 113 (e.g., channel plug) in the upper portion (e.g., at the upper end) of channel structure 110. Drain structure 113 can be in contact with the upper end of the semiconductor channel and may be conductively connected to the semiconductor channel Drain structure 113 can include semiconductor materials (e.g., polysilicon) or conductive materials (e.g., metals). In some embodiments, drain structure 113 includes an opening filled with Ti/TiN or Ta/TaN as an adhesion layer and tungsten as a conductor material. By covering the upper end of the semiconductor channel during the fabrication of 3D memory device 100, drain structure 113 can function as an etch stop layer to prevent etching of dielectrics filled in the semiconductor channel, such as silicon oxide and silicon nitride.

In some embodiments, source structure 118 extends vertically through the alternating conductor/dielectric stack and is in contact with substrate 102. Source structure 118 may include an insulating spacer 118-1 and a source contact 118-2 in insulating spacer 118-1. A doped region 119 may be formed in substrate 102 and in contact with source structure 118. Source contact 118-2 may be conductively connected to doped region 119 so that a source voltage can be applied through doped region 119 and source structure 118. Source structure 118 may include a plurality of source portions each extending in a respective memory deck (e.g., 120-1 or 120-2). The source portions, vertically aligned with one another (e.g., along the z-direction), may be in contact with and conductively connected to one another. The cross-section of each source portion along the x-z plane may have a trapezoid shape, of which a lateral dimension may decrease towards substrate 102. As shown in FIG. 1, source structure 118 may have a staggered portion at the interface of adjacent memory decks (120-1 and 120-2). The staggered portion may be along the sidewall of source structure 118. The staggered portion, formed by the difference in lateral dimensions of adjacent source portions, may include a lateral portion in contact with the ends of adjacent source portions. In some embodiments, insulating spacer 118-1 may include a suitable dielectric material such as silicon oxide. In some embodiments, source contact 118-2 may include a suitable conductive material such one or more of tungsten, polysilicon, doped silicon, silicides, aluminum, copper, and cobalt. For example, source contact 118-2 may include polysilicon in the source portion in first memory deck 120-1 and tungsten in the source portion in second memory deck 120-2. Doped region 119 may include suitable dopants with opposite polarity versus substrate 102.

Support pillar 132 may extend in stack structure 120 and/or insulating structure 154. In some embodiments, support pillar 132 extends partially in a staircase region of stack structure 120 and partially in insulating structure 154. Support pillars 132 may provide support to 3D memory device 100 during the fabrication process, such as the formation of conductor layers 114. In some embodiments, a lateral dimension (e.g., diameter) of support pillar 132 is less than or equal to a lateral dimension of channel structure 110. In some embodiments, support pillar 132 may include one or more dielectric materials such as silicon oxide, silicon oxynitride, silicon nitride, high dielectric constant (high-k) dielectrics, arranged radially from the sidewall towards the center of support pillar 132. In some embodiments, support pillar 132 includes the same materials as channel structures 110. In some embodiments, support pillar 132 includes less material than channel structures 110.

Staircase contact structure 122 may each extend vertically in insulating structure 154 and may be in contact with a respective conductor layer 114. Staircase contact structure 122 may be conductively connected to the respective conductor layer 114 and a peripheral circuit (not shown) for applying a gate voltage on the conductor layer 114. Staircase contact structure 122 may include a plurality of contact portions each extending in a respective portion of insulating structure 154 (e.g., the portion corresponding to a memory deck 120-1 or 120-2). The contact portions, vertically aligned with one another (e.g., along the z-direction), may be in contact with and conductively connected to one another. The cross-section of each contact portion along the x-z plane may have a trapezoid shape, of which a lateral dimension may decrease towards substrate 102. As shown in FIG. 1, staircase contact structure 122 may have a staggered portion at the interface of adjacent memory decks (120-1 and 120-2). The staggered portion may be along the sidewall of staircase contact structure 122. The staggered portion, formed by the differences in lateral dimensions of adjacent contact portions, may include a lateral portion in contact with the ends of adjacent contact portions. In some embodiments, staircase contact structure 122 may include a suitable conductive material such one or more of tungsten, polysilicon, doped silicon, silicides, aluminum, copper, and cobalt.

Peripheral contact structure 123 may extend vertically through insulating structure 154 and may be in contact with substrate 102. Peripheral contact structure 123 may be conductively connected to substrate 102 and a peripheral circuit (not shown) for applying a voltage on substrate 102. In some embodiments, a contact doped region 127, formed in substrate 102, is in contact with and conductively connected to peripheral contact structure 123. In some embodiments, contact doped region 127 includes dopants with opposite polarity than substrate 102. Peripheral contact structure 123 may include a plurality of contact portions each extending in a respective portion of insulating structure 154 (e.g., the portion corresponding to a memory deck 120-1 or 120-2). The contact portions, vertically aligned with one another (e.g., along the z-direction), may be in contact with and conductively connected to one another. The cross-section of each contact portion along the x-z plane may have a trapezoid shape, of which a lateral dimension may decrease towards substrate 102. As shown in FIG. 1, peripheral contact structure 123 may have a staggered portion at the interface of adjacent memory decks (120-1 and 120-2). The staggered portion may be along the sidewall of peripheral contact structure 123. The staggered portion, formed by the differences in lateral dimensions of adjacent contact portions, may include a lateral portion in contact with the ends of adjacent contact portions. In some embodiments, peripheral contact structure 123 may include a suitable conductive material such one or more of tungsten, polysilicon, doped silicon, silicides, aluminum, copper, and cobalt.

In some embodiments, staircase contact structure 122 and peripheral contact structure 123 include the same material (s). In some embodiments, staircase contact structure 122 and peripheral contact structure 123 both include tungsten. In some embodiments, staircase contact structure 122 and peripheral contact structure 123 each includes polysilicon in a lower contact portion (e.g., corresponding to memory deck 120-1) and tungsten in an upper contact portion (e.g., corresponding to memory deck 120-2).

3D memory device 100 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND channel structures) is constrained by the thermal budget associated with the peripheral devices that have been formed or to be formed on the same substrate.

Alternatively, 3D memory device 100 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of 3D memory device 100, such as page buffers, decoders, and latches; not shown) is flipped and faces down toward the memory array device (e.g., NAND memory strings) for hybrid bonding. It is understood that in some embodiments, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

Figure 2A:
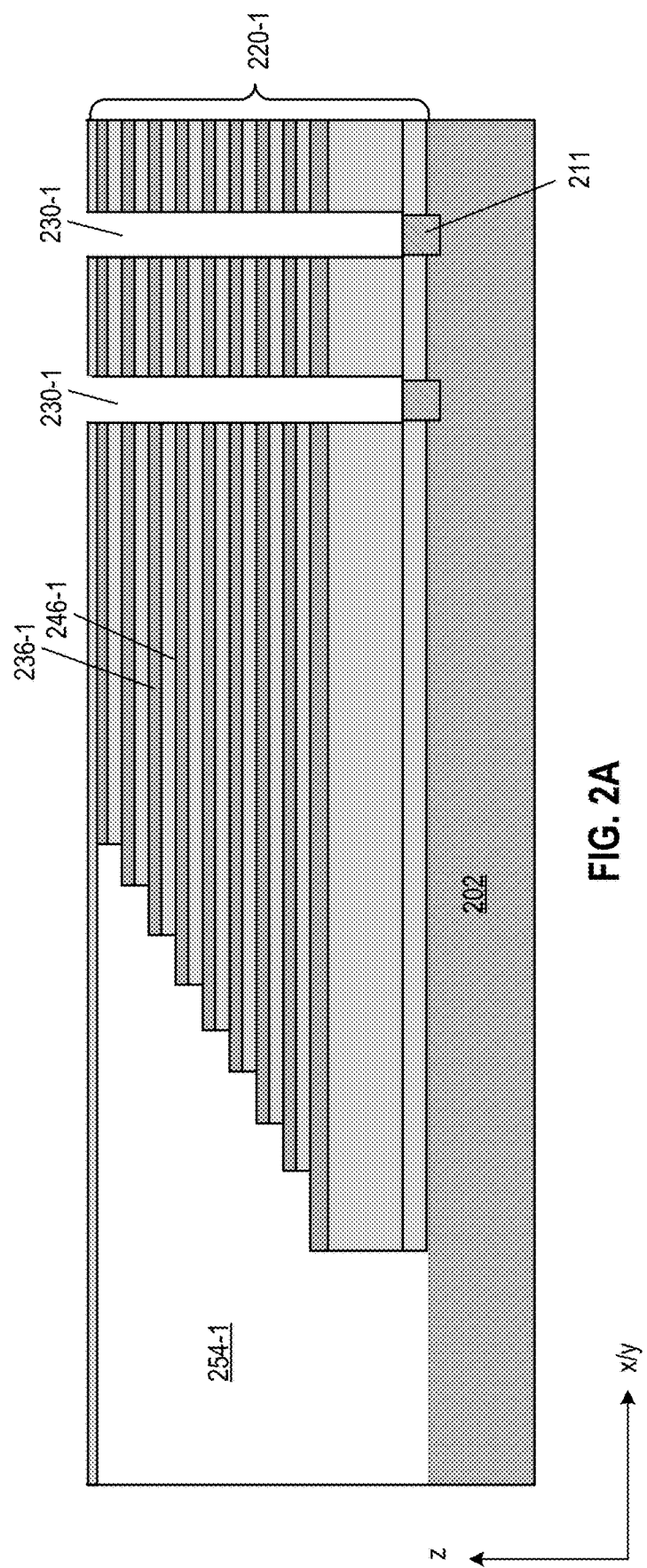
FIGS. 2A-2K illustrates cross-sectional views of a 3D memory device having a multi-deck structure at various stages of an exemplary fabrication process, according to some embodiments of the present disclosure.
Figure 2B:
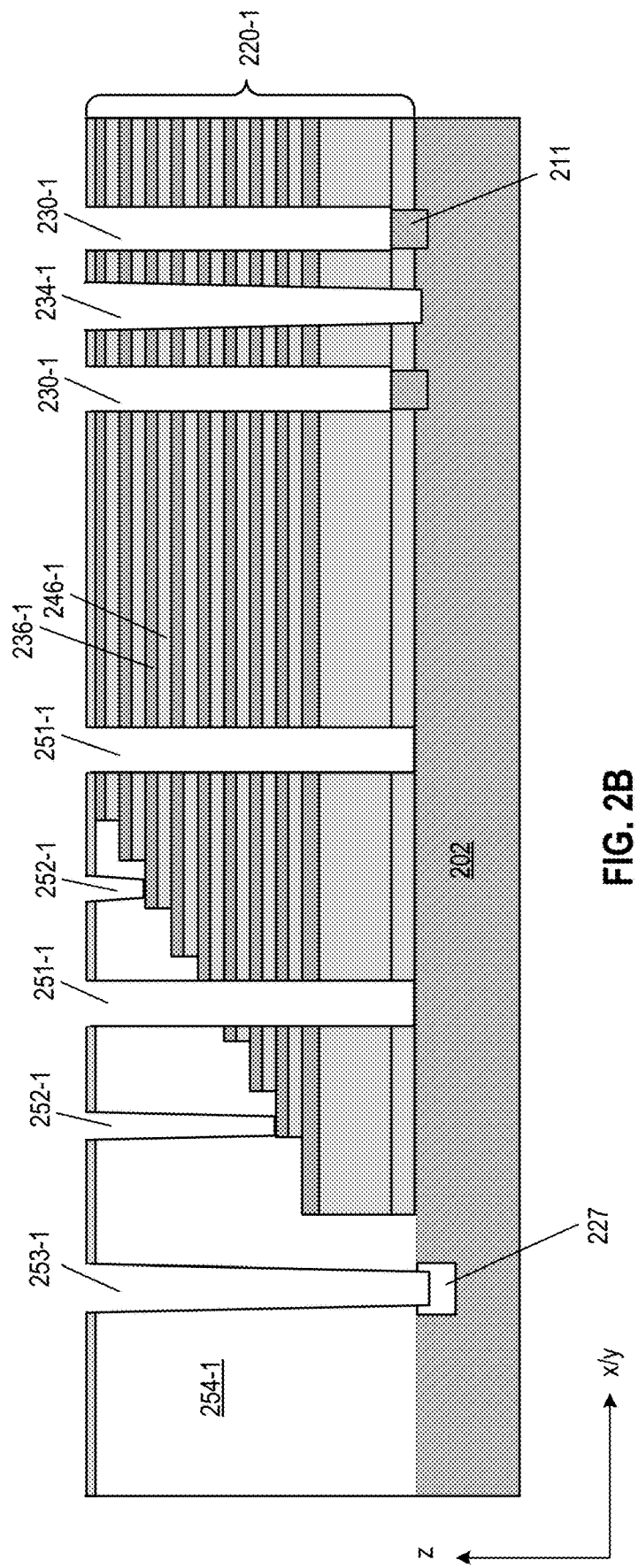
Figure 2C:
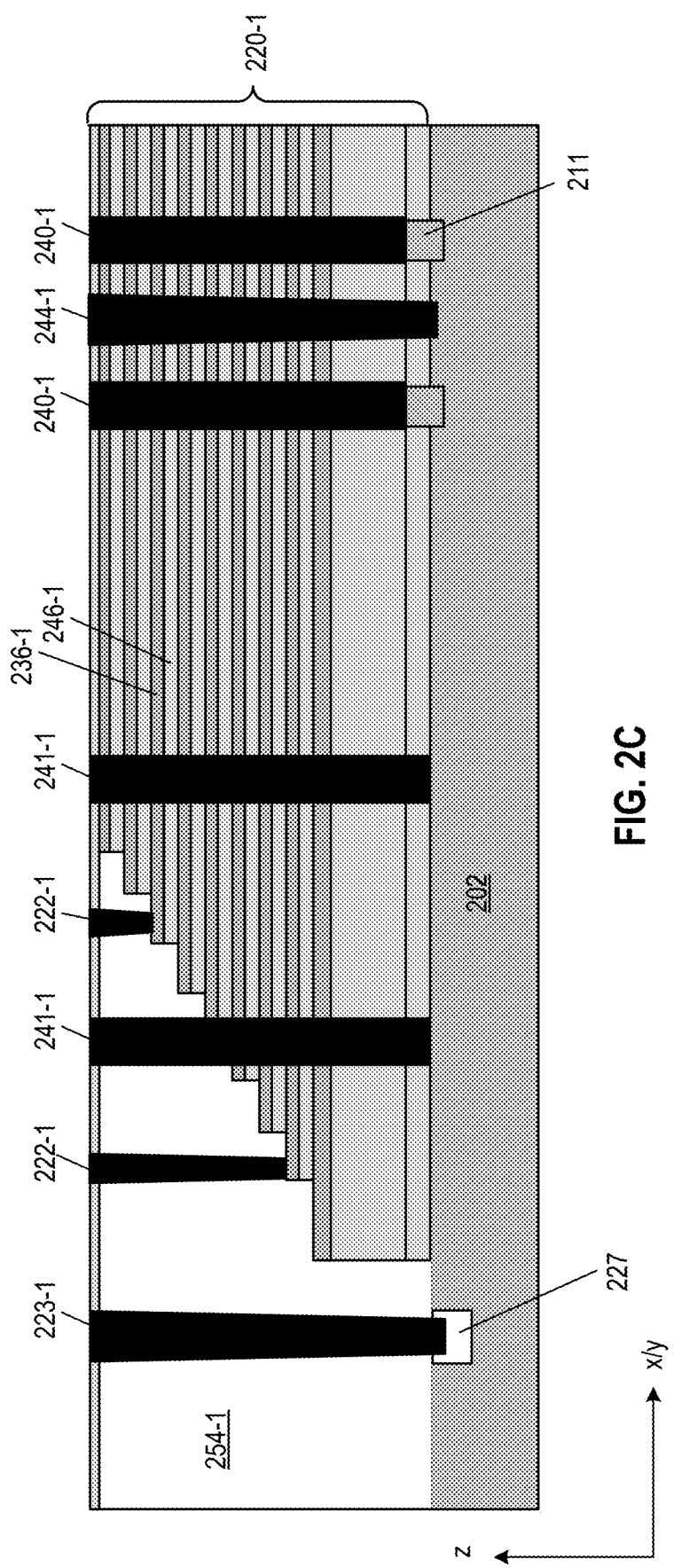
Figure 2D:
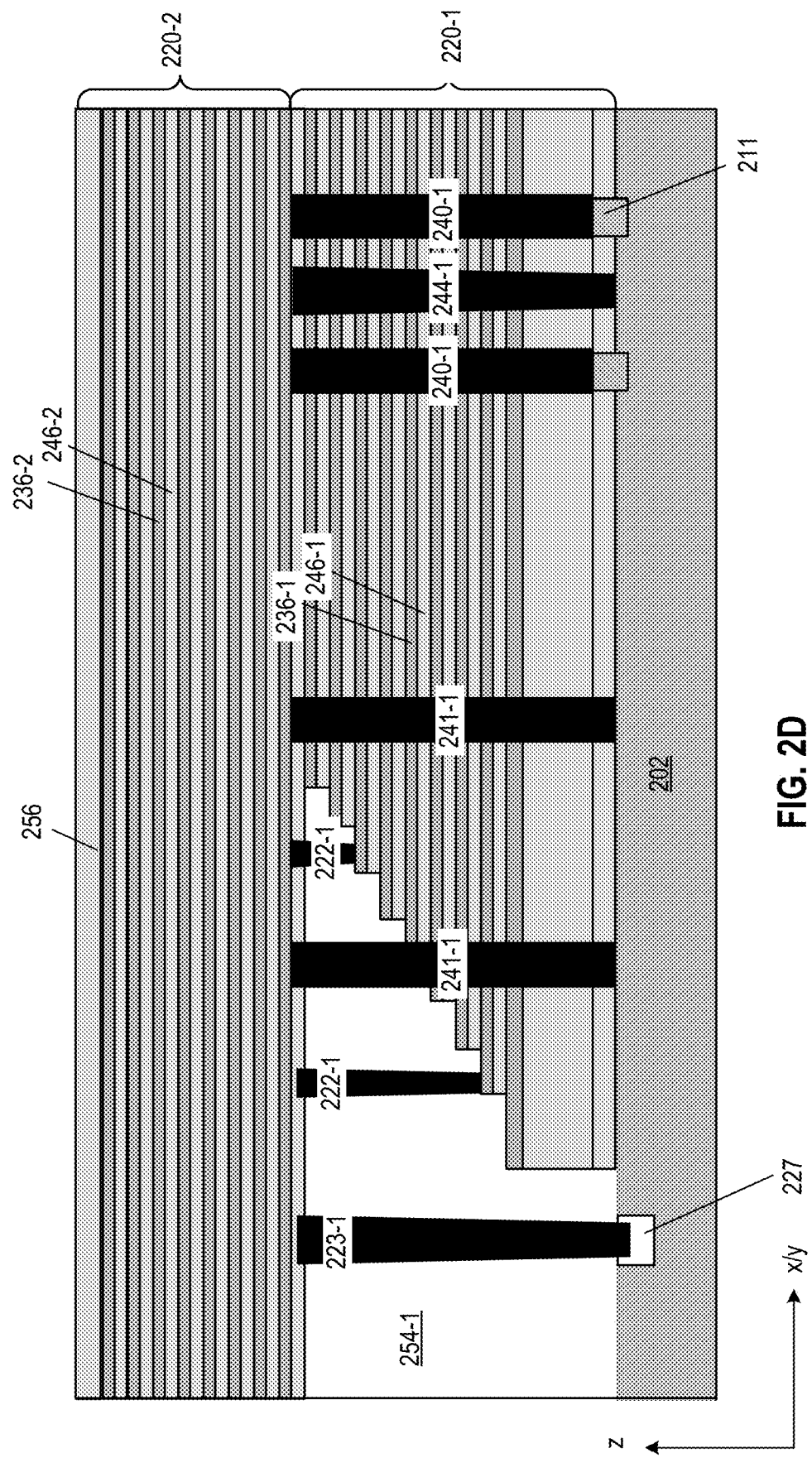
Figure 2E:
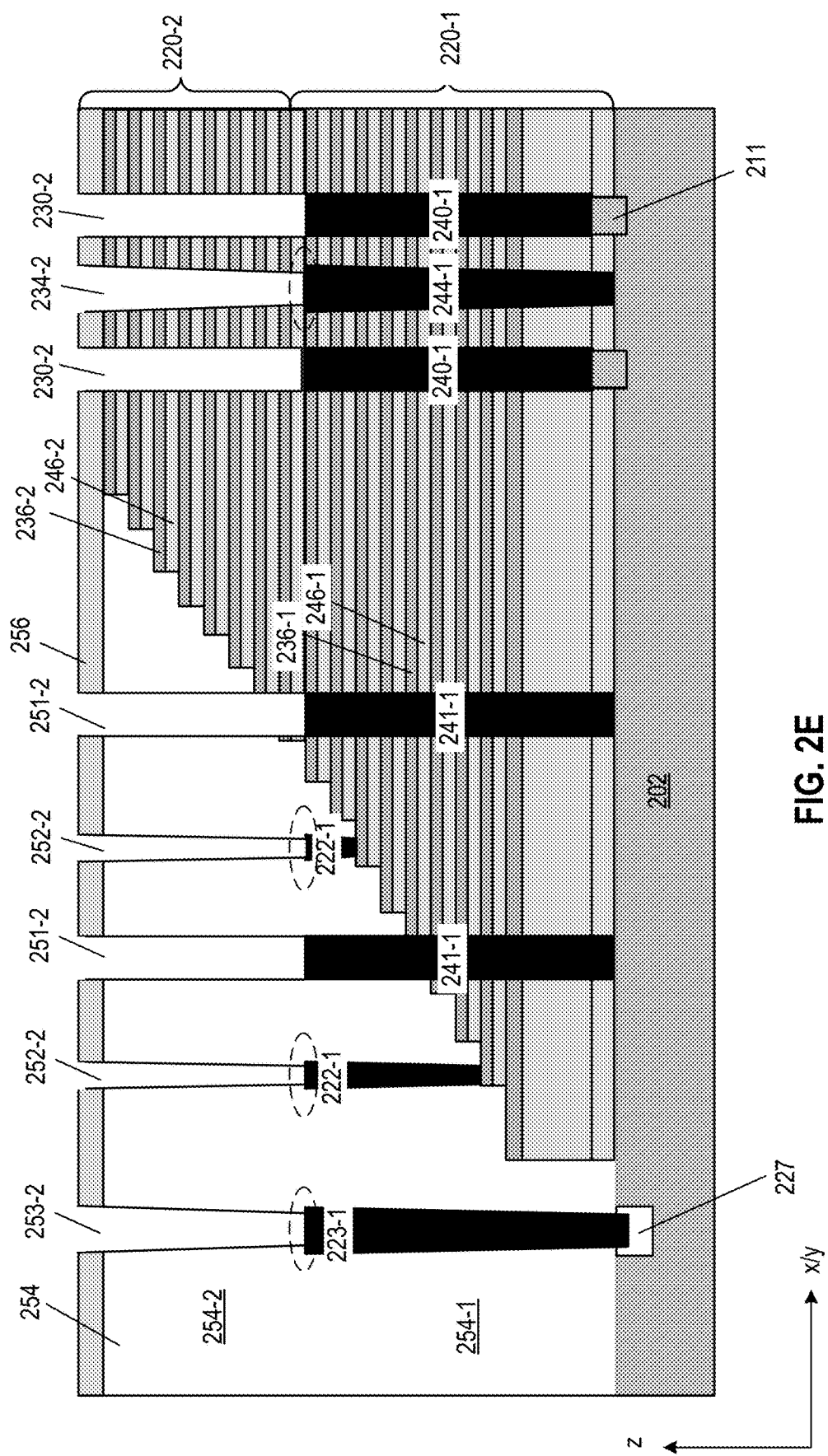
Figure 2F:
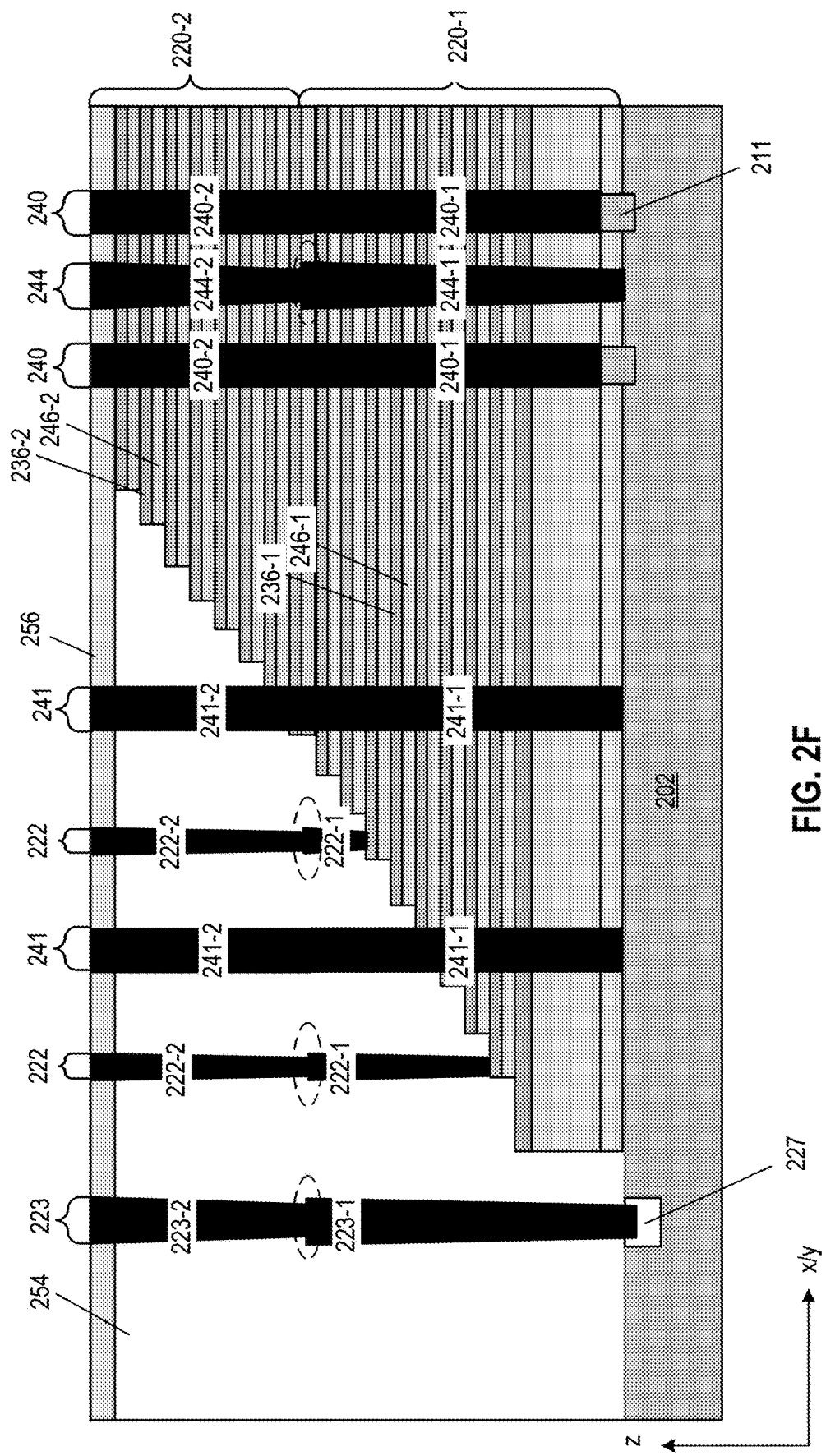
Figure 2G:
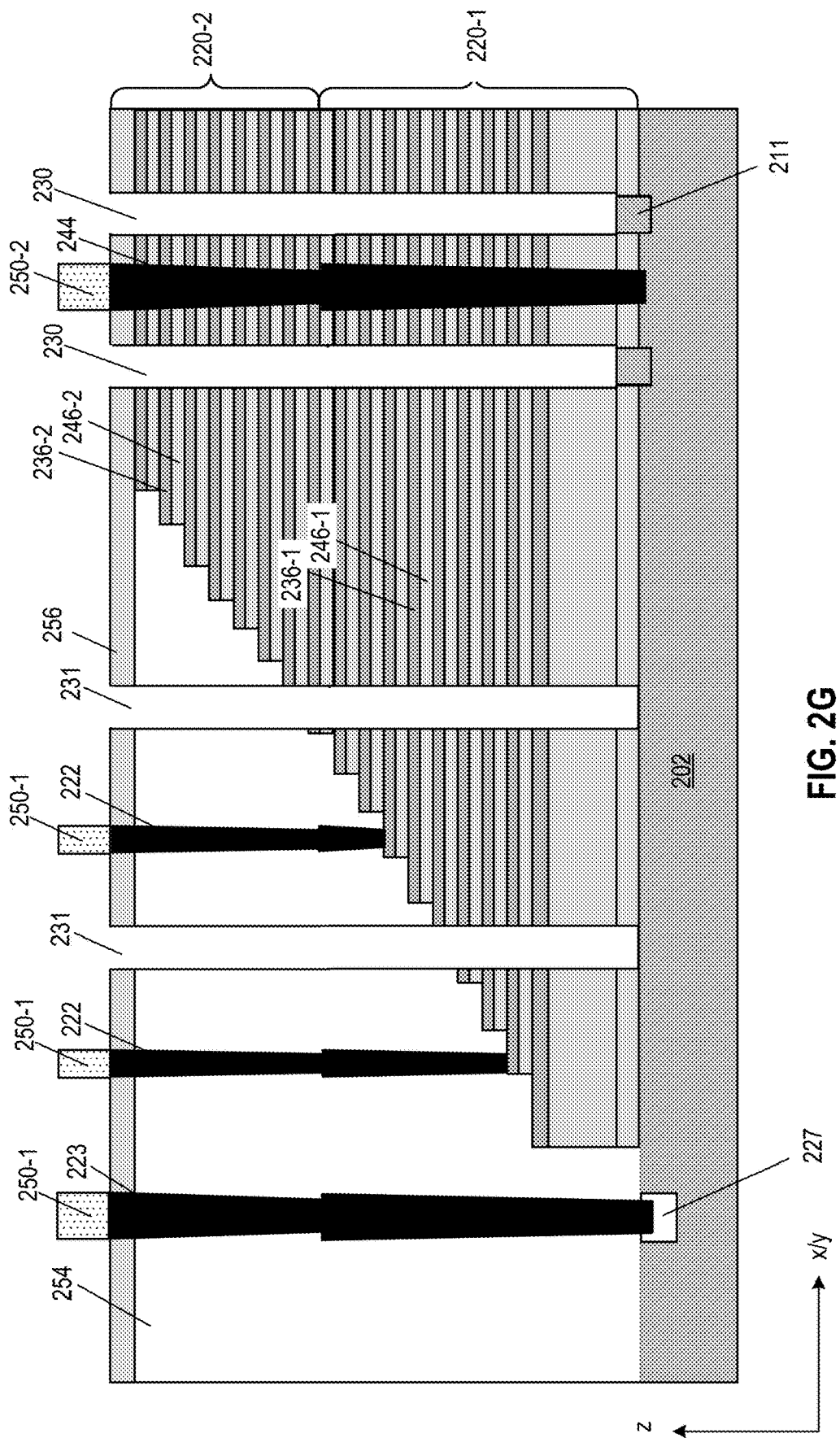
Figure 2H:
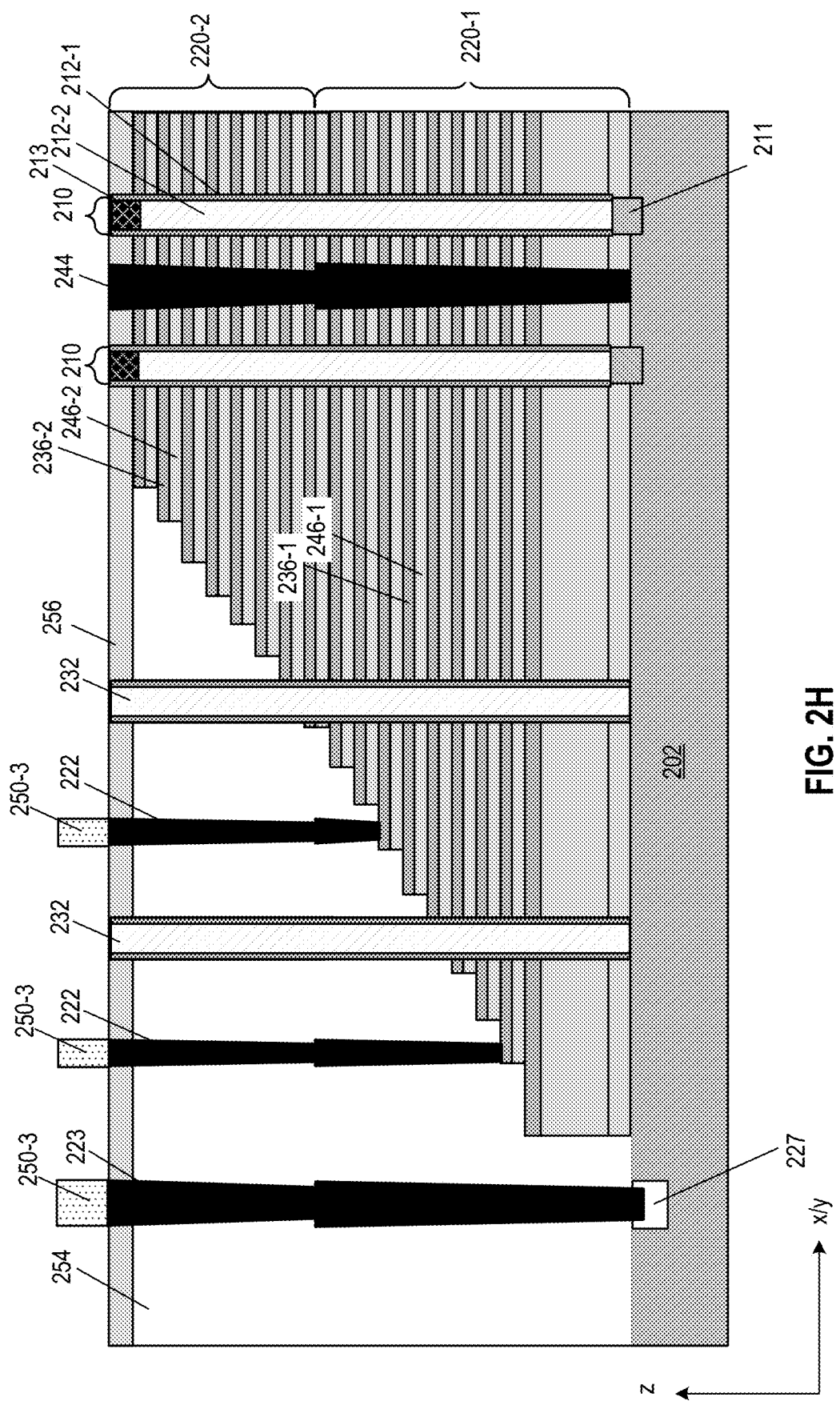
Figure 2I:
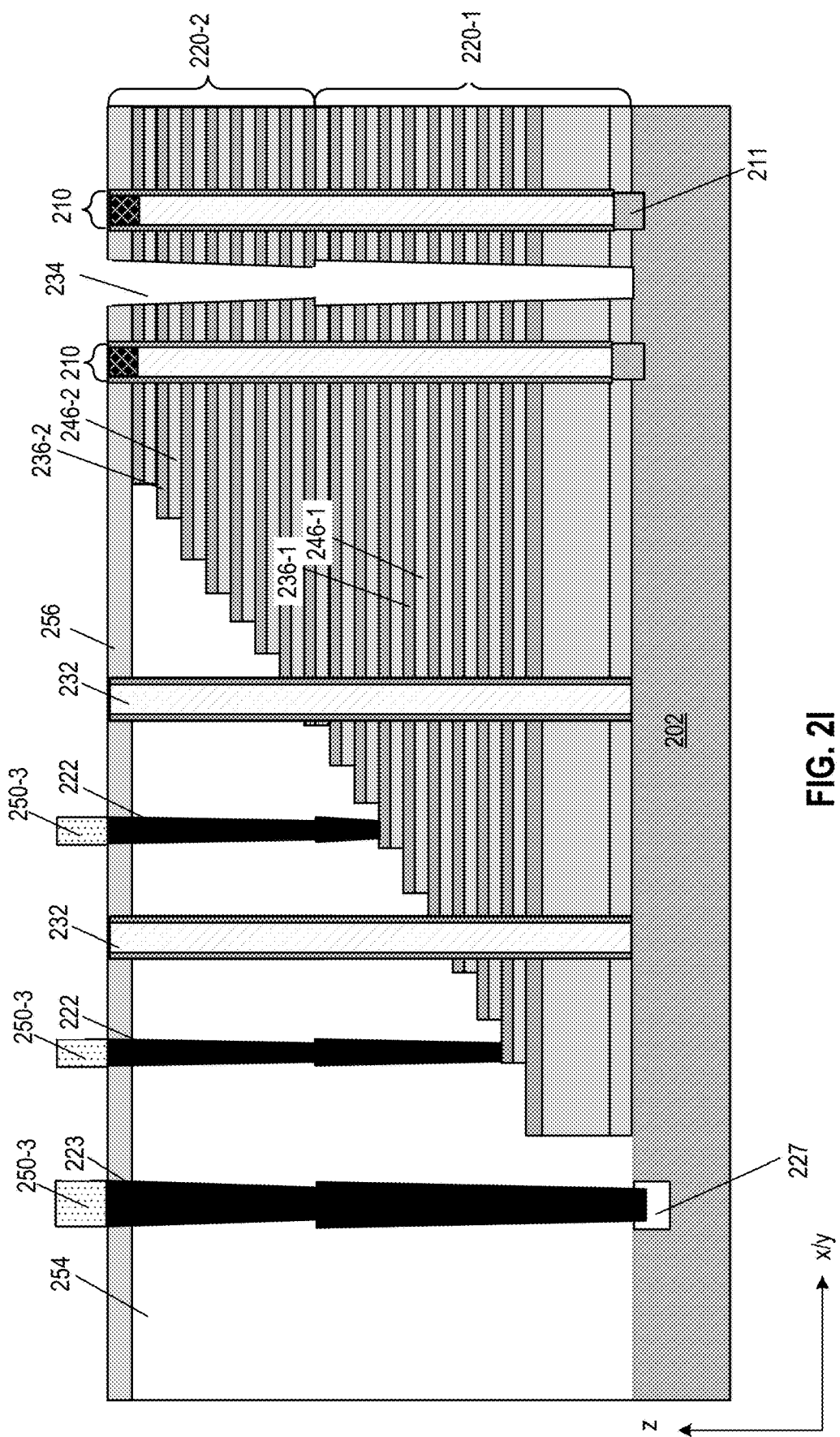
Figure 2J:
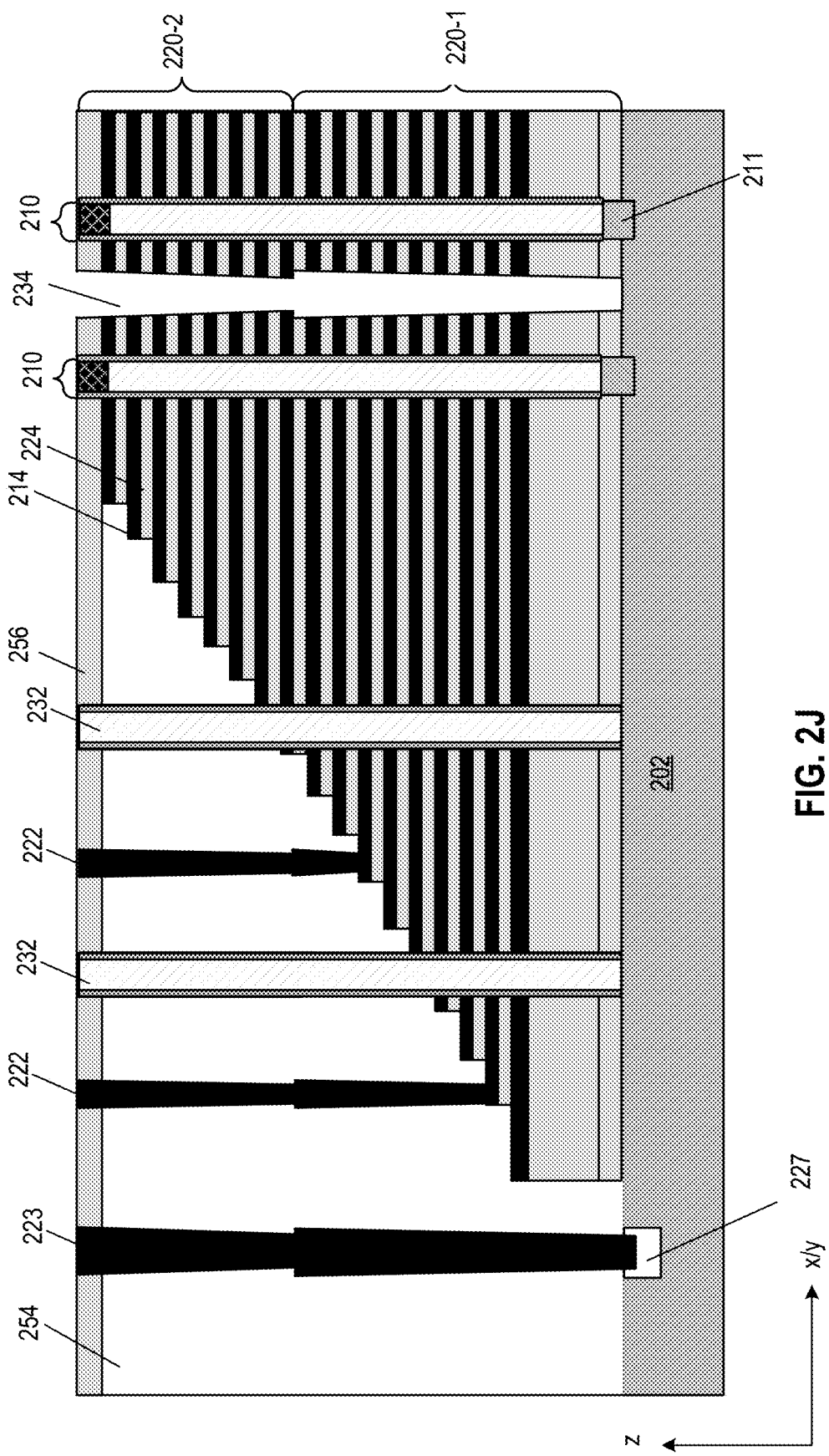
Figure 2K:
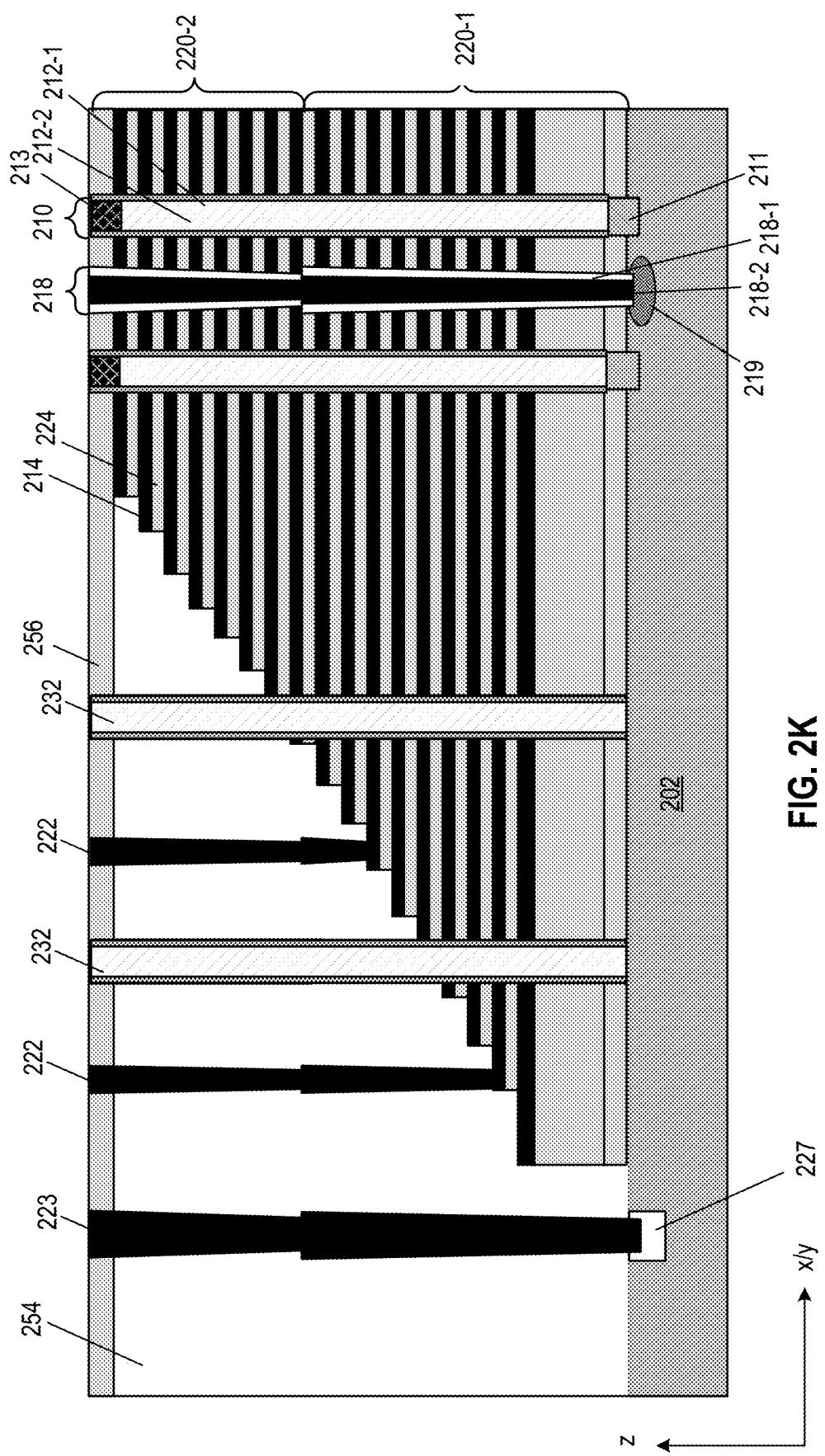
Figure 3A:
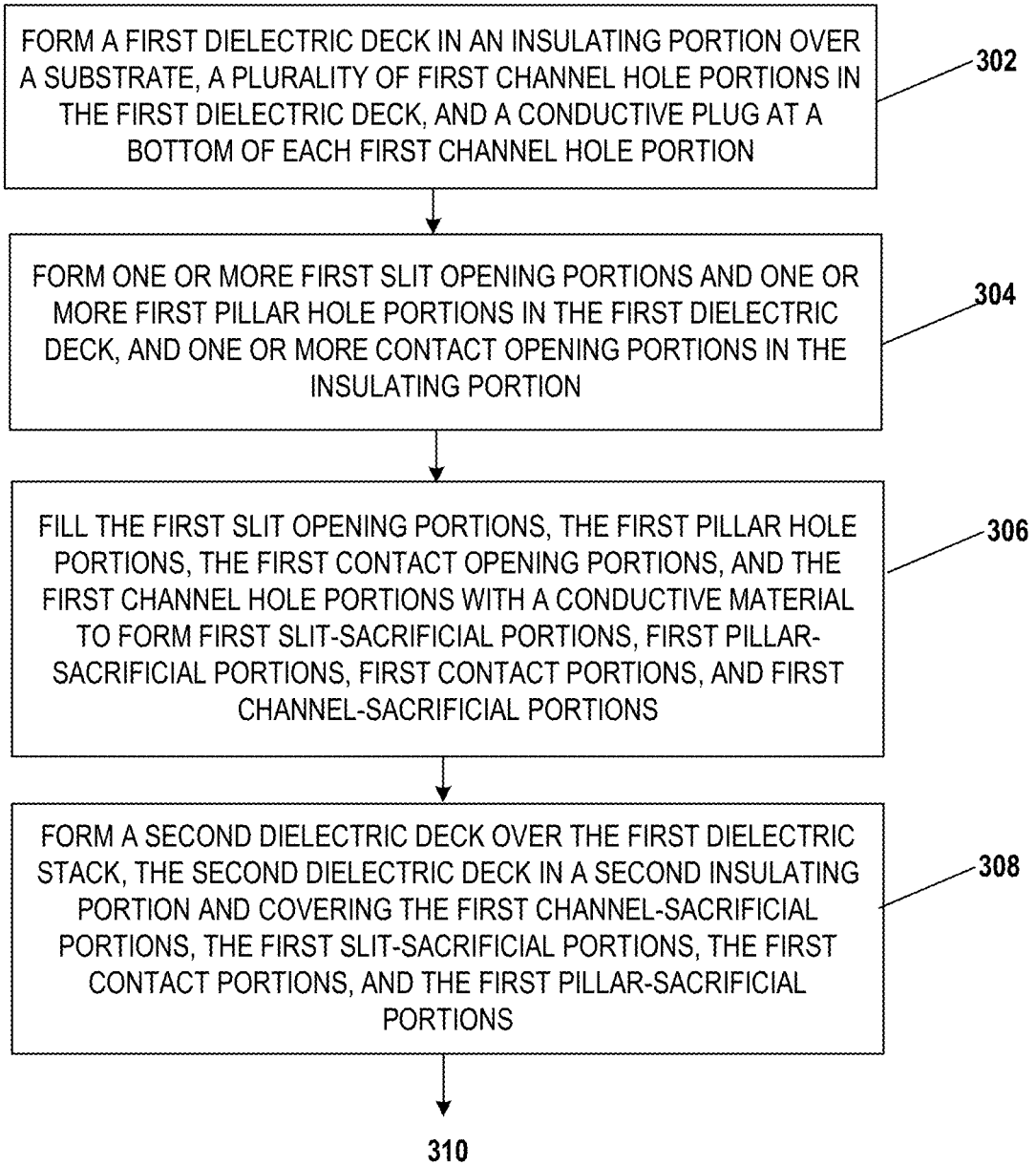
FIGS. 3A-3C illustrate a flowchart of an exemplary fabrication process for forming a 3D memory device having a multi-deck structure, according to some embodiments of the present disclosure.
Figure 3B:
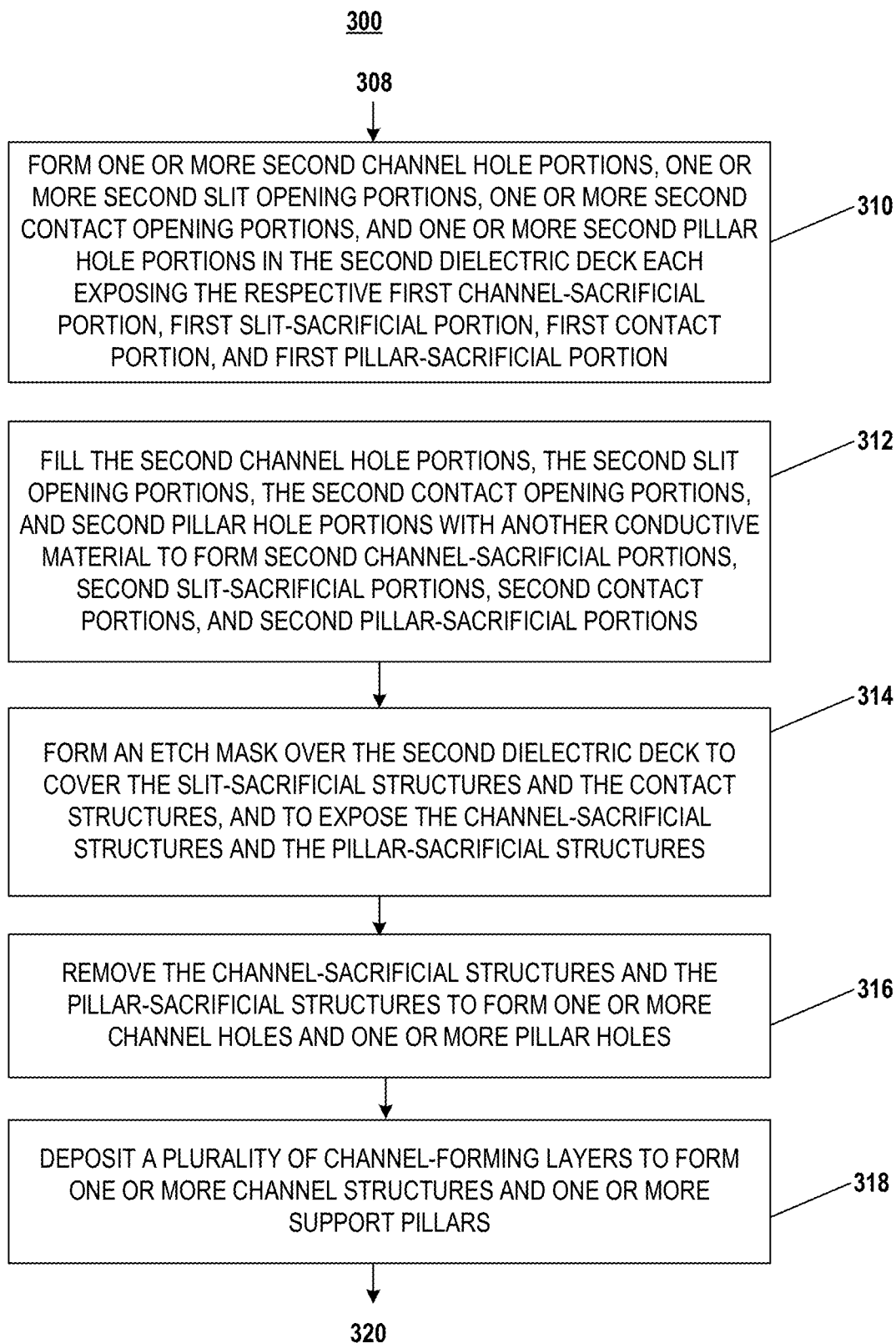
Figure 3C:
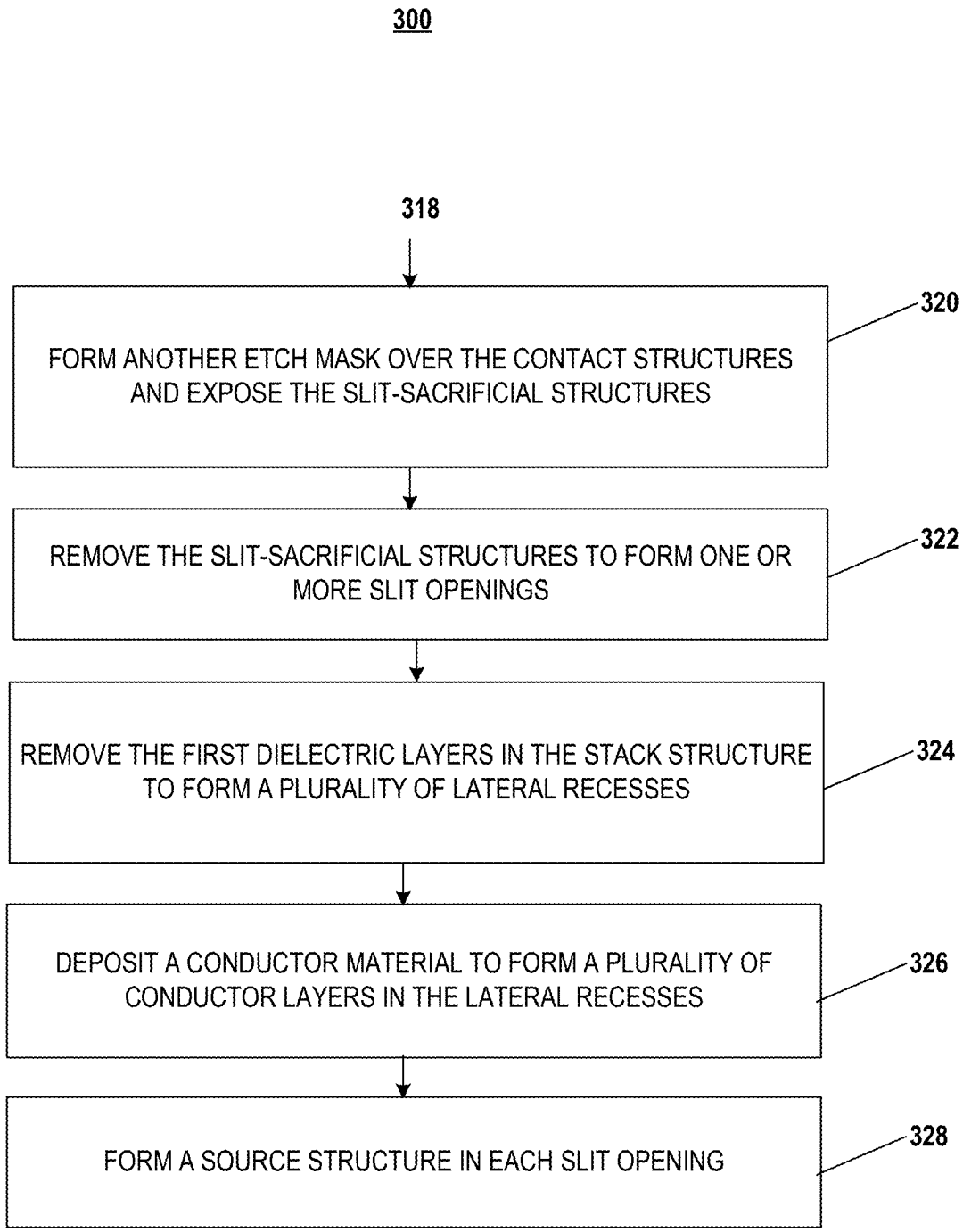

FIGS. 2A-2K illustrate cross-sectional views of 3D memory device 100 with a multi-deck structure at various stages of a fabrication process, according to some embodiments. FIGS. 3A-3C illustrate a flowchart of a fabrication process 300 to form 3D memory device 100. FIG. 3B is a continuation of FIG. 3A, and FIG. 3C is a continuation of FIG. 3B. For ease of illustration, the fabrication process of 3D memory device 100 having a double-deck structure is described. In various embodiments, a 3D memory device may also have more than two decks along the vertical direction (e.g., the z-direction). The fabrication of structures in a 3D memory device with more than two decks can be similar to the fabrication of 3D memory device 100 and is not described herein.

At the beginning of the process, a first dielectric deck in an insulating structure is formed over a substrate, a plurality of first channel hole portions are formed in the first dielectric deck, and a conductive plug is formed at a bottom of each first channel hole portion (Operation 302). FIG. 2A illustrates a corresponding structure.

As shown in FIG. 2A, a first dielectric deck 220-1 may be formed in an insulating portion 254-1 over a substrate 202, and a plurality of first channel hole portion 230-1 may be formed in first dielectric deck 220-1. First dielectric deck 220-1 may have a stack of interleaved first dielectric layers 236-1 and second dielectric layers 246-1 (e.g., dielectric layer pairs). A conductive plug 211 may be formed at the bottom of the respective first channel hole portion 230-1.

First dielectric deck 220-1 may be formed by alternatingly depositing first dielectric layers 236-1 and second dielectric layers 246-1 over substrate 202. First dielectric layers 236-1 and second dielectric layers 246-1 may have different etching selectivities during the subsequent gate-replacement process. In some embodiments, first dielectric layers 236-1 and second dielectric layers 246-1 include different materials. In some embodiments, first dielectric layers 236-1 include silicon nitride, and the deposition of first dielectric layers 236-1 includes one or more of chemical vapor deposition (CVD), physical vapor deposition (PVD), and atomic layered deposition (ALD). In some embodiments, second dielectric layers 246-1 include silicon oxide, and the deposition of second dielectric layers 246-1 includes one or more of CVD, ALD, and PVD.

In some embodiments, as shown in FIG. 2A, first dielectric deck 220-1 includes a staircase portion, which forms a portion of the staircase region in the subsequently-formed stack structure. In some embodiments, the staircase portion is formed by repetitively etching the plurality of interleaved first dielectric layers 236-1 and second dielectric layers 246-1 using an etch mask, e.g., a patterned PR layer over the respective dielectric deck/stack structure. Each first dielectric layer 236-1 and the underlying second dielectric layer 246-1 may be referred to as a dielectric pair. In some embodiments, one or more dielectric pairs can form one level/stair. During the formation of the staircase portion, the PR layer is trimmed (e.g., etched incrementally and inwardly from the boundary of first dielectric deck 220-1, often from all directions) and used as the etch mask for etching the exposed portion of first dielectric deck 220-1. The amount of trimmed PR can be directly related (e.g., determinant) to the dimensions of the stairs. The trimming of the PR layer can be obtained using a suitable etch, e.g., an isotropic dry etch such as a wet etch. One or more PR layers can be formed and trimmed consecutively for the formation of the staircase portion. Each dielectric pair can be etched, after the trimming of the PR layer, using suitable etchants to remove a portion of both the first dielectric layer 236-1 and the underlying second dielectric layer 246-1. The etched first dielectric layers 236-1 and second dielectric layers 246-1 may form stairs in the respective dielectric deck. The PR layer can then be removed.

A suitable dielectric material may be deposited on substrate 202 to cover at least the staircase portion of first dielectric deck 220-1 and form insulating portion 254-1. First dielectric deck 220-1 may be positioned in insulating portion 254-1. In some embodiments, insulating portion 254-1 includes silicon oxide, silicon nitride, and/or silicon oxynitride, and is deposited by one or more of CVD, PVD, and ALD. Optionally, a planarization process, e.g., dry/wet etch and/or CMP, is performed to remove any excess material (e.g., the deposited dielectric material) on the top surface of first dielectric deck 220-1.

A plurality of first channel hole portions 230-1 may be formed extending vertically through first dielectric deck 220-1. The plurality of first channel hole portions 230-1 may be formed by performing an anisotropic etching process (e.g., dry etch) and/or an isotropic etching process (wet etch), using an etch mask such as a patterned PR layer, to remove portions of first dielectric layers 236-1 and second dielectric layers 246-.

A recess region may be formed at the bottom of each first channel hole portion 230-1 to expose a top portion of substrate 202 by the same etching process that forms the respective first channel hole portion 230-1 above substrate 202 and/or by a separate recess etching process. In some embodiments, conductive plug 211 is formed at the bottom of each first channel hole portion 230-1, e.g., over the recess region. Conductive plug 211 may be formed by an epitaxial growth process and/or a deposition process and may include a semiconductor material. In some embodiments, conductive plug 211 is formed by epitaxial growth and is referred to as an epitaxial portion. Optionally, a recess etch (e.g., dry etch and/or wet etch) may be performed to remove excess semiconductor material on the sidewall of the channel hole and/or control the top surface of conductive plug 211 at a desired position. In some embodiments, conductive plug 211 includes single crystalline silicon and is formed by epitaxially grown from substrate 102. In some embodiments, conductive plug 211 includes polysilicon formed by a deposition process. The formation of epitaxially-grown epitaxial portion can include, but not limited to, vapor-phase epitaxy (VPE), liquid-phase epitaxy (LPE), molecular-beam epitaxy (MPE), or any combinations thereof. The formation of the deposited epitaxial portion may include, but not limited by, CVD, PVD, and/or ALD. In various embodiments, the staircase portion and insulating portion 254-1 may be formed before or after the formation of first channel hole portions 230-1.

Referring back to FIG. 3A, after the formation of the first channel hole portions and the conductive plugs, one or more first slit opening portions and one or more first pillar hole portions are formed in the first dielectric deck, and one or more first contact opening portions are formed in the insulating portion (Operation 304). FIG. 2B illustrates a corresponding structure.

As shown in FIG. 2B, in a same patterning/etching process, one or more first slit opening portions 234-1 and one or more first pillar hole portions 251-1 may be formed vertically through first dielectric deck 220-1, and one or more first contact opening portions may be formed in insulating portion 254-1. The first contact opening portions may include one or more first staircase contact opening portions 252-1 and one or more peripheral contact opening portion 253-1. In some embodiments, at least one first pillar hole portion 251-1 intersects with the staircase portion of first dielectric deck 220-1. First staircase contact opening portion 252-1 may extend in insulating portion 254-1 and expose a respective first dielectric layer 236-1. First peripheral contact opening portion 253-1 may be located away from first dielectric deck 220-1 (e.g., having no intersection with first dielectric deck 220-1) and expose substrate 202. In some embodiments, a contact doped region 227 is formed in substrate 202 at the bottom of first peripheral contact opening portion 253-1.

In some embodiments, a suitable anisotropic etching process (e.g., dry etch) and a suitable isotropic etching process (e.g., wet etch), can be performed to remove portions of first dielectric deck 220-1 and insulating portion 254-1 to form first slit opening portions 234-1, first pillar hole portions 251-1, and the first contact opening portions (e.g., 252-1 and 253-1). In some embodiments, the cross-sections of first slit opening portion 234-1 and the first contact opening portion (e.g., 252-1 and 253-1) each includes a trapezoid shape, with a lateral dimension gradually decreases towards substrate 202. In some embodiments, a lateral dimension (e.g., diameter) of first pillar hole portion 251-1 is less than or equal to a lateral dimension (e.g., diameter) of first channel hole portion 230-1. In some embodiments, an ion implantation process is performed to form contact doped region 227 in substrate 202.

Referring back to FIG. 3A, after the formation of the first slit opening portions, the first pillar hole portions, and the first contact opening portions, a conductive material is deposited to fill in the first channel hole portions, the first slit opening portions, the first pillar hole portions, and the first contact opening portions to form first channel-sacrificial portions, first slit-sacrificial portions, first pillar-sacrificial portions, and first contact portions (Operation 306). FIG. 2C illustrates a corresponding structure.

As shown in FIG. 2C, in the same deposition process, a conductive material can be deposited to fill in first channel hole portions 230-1, first slit opening portions 234-1, first pillar hole portions 251-1, and the first contact opening portions (e.g., first staircase contact opening portions 252-1 and first peripheral contact opening portions 253-1) to respective form first channel-sacrificial portions 240-1, first slit-sacrificial portions 244-1, first pillar-sacrificial portions 241-1, and the first contact portions (e.g., first staircase contact portions 222-1 and first peripheral contact portions 223-1). The conductive material may include one or more of tungsten, polysilicon, doped silicon, silicides, cobalt, aluminum, and copper, and can be deposited using a suitable deposition process such as one or more of CVD, PVD, ALD, and electroplating. Optionally, a planarization process, e.g., dry/wet etch and/or CMP, is performed to remove any excess material (e.g., the deposited conductive material) on the top surface of first dielectric deck 220-1 and insulating portion 254-1.

Referring back to FIG. 3A, after the formation of the first channel-sacrificial portions, the first slit-sacrificial portions, the first pillar-sacrificial portions, and the first contact portions, a second dielectric deck is formed in another insulating portion over the first dielectric deck and the insulating portion (Operation 308). The second dielectric deck and the other insulating portion cover the first channel-sacrificial portions, the first slit-sacrificial portions, the first pillar-sacrificial portions, and the first contact portions. FIGS. 2D and 2E illustrate corresponding structures.

As shown in FIG. 2D, a second dielectric deck 220-2 may be formed over first dielectric deck 220-1 and cover first channel-sacrificial portions 240-1, first slit-sacrificial portions 244-1, first pillar-sacrificial portions 241-1, and the first contact portions (e.g., 222-1 and 223-1). Second dielectric deck 220-2 may include interleaved a plurality of first dielectric layer 236-2 and a plurality of second dielectric layers 246-2 (e.g., forming a plurality of dielectric pairs). In some embodiments, first dielectric layers 236-2 may be similar to or the same as first dielectric layers 236-1, and second dielectric layers 246-2 may be similar to or the same as second dielectric layers 246-1. The formation of second dielectric deck 220-2 may be similar to or the same as the formation of first dielectric deck 220-1 and the detailed description is not repeated herein.

In some embodiments, as shown in FIG. 2E, another staircase portion is formed in second dielectric deck 220-2. The formation of the other staircase portion may be the same as or similar to the formation of the staircase portion in first dielectric deck 220-1. The detailed description is thus not repeated herein. In some embodiments, the formation of the other staircase portion may expose insulating portion 254-1 and the first contact portions (e.g., 222-1 and 222-3). In some embodiments, the etching of first dielectric layers 236-2 and second dielectric layers 246-2 is controlled so the formation of the other staircase portion has minimized the impact on first insulating portion 254-1. For example, the etching time for first dielectric layers 236-2 and second dielectric layers 246-2 is controlled so little or no damage is formed to first insulating portion 254-1 and the first contact portions (e.g., 222-1 and 223-1). First dielectric deck 220-1 and second dielectric deck 220-2 may form a stack structure 220.

As shown in FIG. 2E, another insulating portion 254-2 may be formed to cover at least the other staircase portion, the first contact portions (e.g., 222-1 and 222-3), and insulating portion 254-1. Second dielectric deck 220-2 may thus be in other insulating portion 254-2. The formation of other insulating portion 254-2 may be the same as or similar to the formation of insulating portion 254-1, and the detailed description is not repeated herein. Optionally, a dielectric cap layer 256 is deposited over second dielectric deck 220-2. Dielectric cap layer 256 may include a suitable dielectric material such as silicon oxide and may be deposited by CVD, PVD, and/or ALD. Optionally, a planarization process (e.g., CMP and/or recess etch) is performed to remove any excess material (e.g., the material of other insulating portion 254-2) on the top surface of second dielectric deck 220-2. The other staircase portion in second dielectric deck 220-2 and the staircase structure in first dielectric deck 220-1 may form a staircase structure in stack structure 220. Insulating portion 254-1 and other insulating portion 254-2 may form an insulating structure 254 in which stack structure 220 is located.

Referring back to FIG. 3B, one or more second channel hole portions, one or more second slit opening portions, one or more second contact opening portions, and one or more second pillar hole portions are formed to each expose the respective first channel-sacrificial portion, first slit-sacrificial portion, first contact portion, and first pillar-sacrificial portion (Operation 310). FIG. 2E illustrates a corresponding structure.

As shown in FIG. 2E, in a same patterning/etching process, one or more second channel hole portions 230-2, one or more second slit opening portions 234-2, one or more second contact opening portions, and one or more second pillar hole portions 251-2 are formed to extend vertically (e.g., along the z-direction) above substrate 202. The second contact opening portions may include one or more second staircase contact opening portions 252-2 and one or more peripheral contact opening portions 253-2, each extending in insulating structure 254 (or second insulating portion 254-2) and exposing the respective first staircase contact portion 222-1 and first peripheral contact portion 223-1. Second slit opening portions 234-2, second channel hole portions 230-2, and second pillar hole portions 251-2 may be formed extending through second dielectric deck 220-2 and exposing the respective first slit-sacrificial portions 244-1, first channel-sacrificial portions 240-1, and first pillar-sacrificial portions 241-1. Each of second channel hole portion 230-2, second slit opening portion 234-2, the second contact opening portion (e.g., 252-2 and 253-2), and second pillar hole portion 251-2 may be aligned vertically (e.g., along the z-direction) with the respective first channel-sacrificial portion 240-1, first slit-sacrificial portion 244-1, the first contact portion (e.g., 222-1 and 223-1), and first pillar-sacrificial portion 241-1.

In some embodiments, the cross-sections of second slit opening portion 234-2 and the second contact opening portion (e.g., 252-2 and 253-2) each includes a trapezoid shape, with a lateral dimension gradually decreases towards substrate 202. In some embodiments, a lateral dimension of second pillar hole portion 251-2 is less than a lateral dimension of second channel hole portion 230-2. In some embodiments, at the interface of first dielectric deck 220-1 and second dielectric deck 220-2, a lateral dimension (e.g., diameter) of second slit opening portion 234-2 is less than a lateral dimension (e.g., diameter) of first slit-sacrificial portion 244-1, and a lateral dimension (e.g., diameter) of the second contact opening portion (e.g., 252-2 and 253-2) is less than a lateral dimension (e.g., diameter) of the first contact portion (e.g., 222-1 and 223-1). Accordingly, at the interface, a lateral portion of the first contact portion (e.g., 222-1 and 223-1) may surround the second contact opening portion (e.g., 252-2 and 253-2), and a lateral portion of first slit-sacrificial portion 244-1 may surround second slit opening portion 234-2. A staggered portion may be formed between first slit opening portion 234-1 and second slit opening portion 234-2, and between the first contact opening portion (e.g., 252-1 and 253-1) and the second contact opening portion (e.g., 252-2 and 253-2). In some embodiments, the cross-sections of second pillar hole portion 251-2, first pillar hole portion 251-1, second channel hole portion 230-2, and first channel hole portion 230-1 also have a trapezoid shape, with a lateral dimension gradually decreases towards substrate 202. A staggered portion may be formed between second pillar hole portion 251-2 and first pillar hole portion 251-1, between second channel hole portion 230-2 and first channel hole portion 230-1, and between second pillar hole portion 251-2 and first pillar hole portion 251-1, at the interface of first dielectric deck 220-1 and second dielectric deck 220-2. A suitable anisotropic etching process (e.g., dry etch) and/or a suitable isotropic etching process (e.g., wet etch) may be employed to remove portions of second dielectric deck 220-2 and other insulating portion 254-2 and form second channel hole portions 230-2, second slit opening portions 234-2, the second contact opening portions (e.g., 252-2 and 253-2), and second pillar hole portions 251-2.

Referring back to FIG. 3B, after the formation of the second channel hole portions, the second slit opening portions, the second contact opening portions, and the second pillar hole portions, another conductive material is deposited to fill in the second channel hole portions, the second slit opening portions, the second contact opening portions, and the second pillar hole portions to form second channel-sacrificial portions, second slit-sacrificial portions, second contact portions, and second pillar-sacrificial portions (Operation 312). FIG. 2F illustrates a corresponding structure.

As shown in FIG. 2F, in the same deposition process, another conductive material may be deposited to fill in second channel hole portions 230-2, second slit opening portions 234-2, the second contact opening portions (e.g., 252-2 and 253-2), and second pillar hole portions 251-2 to form second channel-sacrificial portions 240-2, second slit-sacrificial portions 244-2, the second contact portions, and second pillar-sacrificial portions 241-2. The second contact portions may include second staircase contact portions 222-2 and second peripheral contact portions 223-2. In some embodiments, each of second channel-sacrificial portion 240-2, second slit-sacrificial portion 244-2, the second contact portion (e.g., 222-2 or 223-2), and second pillar-sacrificial portion 241-2 is in contact with respective first channel-sacrificial portion 240-1, first slit-sacrificial portion 244-1, the first contact portion (e.g., 222-1 or 223-1), and first pillar-sacrificial portion 242-1. Each first pillar-sacrificial portion 241-1 and the respective second pillar-sacrificial portion 241-2 may form a pillar-sacrificial structure 241. Each first slit-sacrificial portion 244-1 and the respective second slit-sacrificial portion 244-2 may form a slit-sacrificial structure 244. Each first channel-sacrificial portion 240-1 and the respective second channel-sacrificial portion 240-2 may form a channel-sacrificial structure 240. Each first staircase contact portion 222-1 and the respective second staircase contact portion 222-2 may form a staircase contact structure 222. Each first peripheral contact portion 223-1 and the respective second peripheral contact portion 223-2 may form a peripheral contact structure 223. Staircase contact structures 222 and peripheral contact structures 223 may be referred to as contact structures. In some embodiments, the difference between lateral dimensions of first contact portion (e.g., 222-1 or 223-1) and second contact portion (e.g., 222-2 or 223-2) of a contact structure (e.g., 222 or 223) may form a staggered portion/shape at the interface. In some embodiments, the difference between lateral dimensions of first slit-sacrificial portion 244-1 and second slit-sacrificial portion 244-2 may form a staggered portion/shape at the interface.

The other conductive material may be the same as or different from the conductive material that fills first channel hole portions 230-1, first slit opening portions 234-1, the first contact opening portion (e.g., 252-1 and 253-1), and first pillar hole portions 251-1. For example, the other conductive material may include one or more of tungsten, polysilicon, silicides, doped silicon, aluminum, copper, and cobalt. In some embodiments, the conductive material includes polysilicon and the other conductive material includes tungsten. In some embodiments, both the conductive material and the other conductive material include tungsten. The other conductive material may be deposited by a suitable deposition process such as CVD, PVD, ALD, and/or electroplating. Optionally, a planarization process (e.g., CMP and/or recess etch) is performed to remove excess materials, e.g., the other conductive material, on the top surface of second dielectric deck 220-2.

Referring back to FIG. 3B, after the formation of channel-sacrificial structures, slit-sacrificial structures, contact structures, and pillar-sacrificial structures, an etch mask is formed over the stack structure to cover the slit-sacrificial structures and the contact structures, and to expose the channel-sacrificial structures and the pillar-sacrificial structures (Operation 314). FIG. 2G illustrates a corresponding structure.

As shown in FIG. 2G, an etch mask 250, a patterned etch mask, can be formed over stack structure 220 (e.g., second dielectric deck 220-2) to cover slit-sacrificial structures 244 and the contact structures (e.g., 222 and 223), and to expose channel-sacrificial structures 240 and pillar-sacrificial structures 241. Specifically, etch mask 250 may have a portion 250-1 that covers staircase contact structures 222 and peripheral contact structures 223, and another portion 250-2 that covers slit-sacrificial structure 244. Etch mask 250 may include any suitable material that can sustain the etching process. For example, etch mask 250 may include a soft material (e.g., photoresist), a hard material (e.g., carbon, polysilicon, and silicon carbide), or a combination thereof. Etch mask 250 may have a single-layered structure or a multi-layered structure. In some embodiments, etch mask 250 is a patterned photoresist layer.

Referring back to FIG. 3B, after the formation of the etch mask, the channel-sacrificial structures and the pillar-sacrificial structures are removed to form one or more channel holes and one or more pillar holes (Operation 316). FIG. 2G illustrates a corresponding structure.

Referring back to FIG. 2G, in the same etching process, channel-sacrificial structures 240 and pillar-sacrificial structures 241 are removed to form channel holes 230 and pillar holes 231. Channel hole 230 may expose conductive plug 211 and pillar hole 231 may expose substrate 202. A suitable anisotropic etching process (e.g., dry etch) and/or a suitable isotropic etching process (e.g., wet etch) can be performed to remove channel-sacrificial structures 240 and pillar-sacrificial structures 241 and form channel holes 230 and pillar holes 251. In some embodiments, channel hole 230 is formed by the joint connection of first channel hole portion 230-1 and second channel hole portion 230-2, and pillar hole 231 is formed by the joint connection of first pillar hole portion 231-1 and second pillar hole portion 231-2.

Referring back to FIG. 3B, after the formation of channel holes and pillar holes, a plurality of channel-forming layers to form one or more channel structures in the channel holes and one or more support pillars in the pillar holes (Operation 318). FIG. 2H illustrates a corresponding structure.

As shown in FIG. 2H, a channel-forming structure, which includes a plurality of channel-forming layers, can be sequentially deposited in channel holes 230 to form a memory film and semiconductor layer 212-1 and a dielectric core 212-2. Specifically, the memory film may include a blocking layer, a memory layer, and a tunneling layer. In some embodiments, the dielectric core, semiconductor layer, the tunneling layer, the memory layer, and the blocking layer are arranged radially from the center toward the sidewall of channel structure 210 in this order. The dielectric core can include silicon oxide. The semiconductor layer can include silicon, such as amorphous silicon, polysilicon, and/or single crystalline silicon. The tunneling layer can include silicon oxide, silicon oxynitride, or any combination thereof. In one example, the memory layer can include a composite layer of silicon oxide/silicon oxynitride (or silicon nitride)/silicon oxide (ONO). The memory layer can include silicon nitride, silicon oxynitride, silicon, or any combination thereof. The blocking layer can include silicon oxide, silicon oxynitride, high dielectric constant (high-k) dielectrics, or any combination thereof.

In some embodiments, a semiconductor channel is formed over and in contact with conductive plug 211 in channel hole 230. In some embodiments, the memory film is first deposited to cover the sidewall of the channel hole and the top surface of conductive plug 211, and a semiconductor layer is then deposited over the memory film and above conductive plug 211. The blocking layer, memory layer, and tunneling layer can be subsequently deposited in this order using one or more thin film deposition processes, such as ALD, CVD, PVD, any other suitable processes, or any combination thereof, to form the memory film. The semiconductor layer can then be deposited on the tunneling layer using one or more thin film deposition processes, such as ALD, CVD, PVD, any other suitable processes, or any combination thereof. In some embodiments, dielectric core 212-2 may fill in the remaining space of channel hole 230 by depositing dielectric materials after the deposition of the semiconductor layer, such as silicon oxide. Dielectric core 212-2 may be deposited by one or more of ALD, CVD, and PVD.

Support pillars 232 may be formed by the same deposition process that forms channel structure 210. In some embodiments, the lateral dimension of pillar hole 251 is less than or equal to the lateral dimension of channel hole 230 so that the deposition of at least a portion of the channel-forming layers can fill up pillar hole 231, forming a support pillar 232. In some embodiments, support pillar 232 includes one or more of silicon oxide, silicon oxynitride, high-k dielectrics, polysilicon, and/or silicon nitride.

In some embodiments, a drain structure 213 is formed in the upper portion of each channel hole 230. In some embodiments, parts of memory film, semiconductor layer, and dielectric core 212-2 on the top surface of stack structure 220 and in the upper portion of each channel hole 230 can be removed by CMP, grinding, wet etching, and/or dry etching to form a recess in the upper portion of channel hole 230 so that a top surface of the semiconductor channel may be located at a desired position in channel hole 230. In some embodiments, etch mask 250 may be removed and an additional mask layer may be formed to expose channel holes 230 for the formation of drain structures 213. In some embodiments, etch mask 250 is not removed and no additional etch mask is needed for the formation of drain structures 213. Drain structure 213 then can be formed by depositing conductive materials, such as metals and/or silicon, into the recess by one or more thin film deposition processes, such as CVD, PVD, ALD, electroplating, electroless plating, or any combination thereof. A channel structure 210 is thereby formed. Optionally, a planarization process, e.g., dry/wet etch and/or CMP, is performed to remove any excess material on the top surface of stack structure 220.

Referring back to FIG. 3C, after the formation of channel structures and support pillar, another etch mask is formed over the contact structure and the slit-sacrificial structures are exposed (Operation 320). FIG. 2H illustrates a corresponding structure.

As shown in FIG. 2H, another etch mask 250-3 may be formed to cover each contact structure (e.g., 222 and 223) and slit-sacrificial structures 244 may be exposed. In some embodiments, channel structures 210 and support pillars 232 are exposed. Etch mask 250-3 may be portion 250-1 of etch mask 250, retained from Operation 318, or may be formed by a separate process, depending on the process that forms drain structure 213. Similar to etch mask 250, etch mask 250-3 may include a soft material and/or a hard material, and may have a single-layered structure or a multi-layered structure. The detailed descriptions of etch mask 250-3 may be referred to the descriptions of etch mask 250 and is not repeated herein.

Referring back to FIG. 3C, after the formation of the other etch mask, the slit-sacrificial structures are removed to form one or more slit openings (Operation 322). FIG. 2I illustrates a corresponding structure.

As shown in FIG. 2I, slit-sacrificial structures 244 may be removed to form slit openings 234, exposing substrate 202. A suitable anisotropic etching process (e.g., dry etch) and/or a suitable isotropic etching process (e.g., wet etch) can be performed to remove slit-sacrificial structures 244 and form slit openings 234, which is formed by the joint connection of adjacent slit opening portions (e.g., first slit opening portion 234-1 and second slit opening portion 234-2). In some embodiments, drain structures 213 may function as etch stop layers to prevent channel structures 210 from being etched.

Referring back to FIG. 3C, after the formation of the slit openings, the first dielectric layers in the stack structure are removed through the slit opening to form a plurality of lateral recesses in the stack structure (Operation 324), and a conductor material is deposited to form a plurality of conductor layers in the lateral recesses of the stack structure (Operation 326). FIG. 2J illustrates a corresponding structure.

As shown in FIG. 2J, first dielectric layers 236-1 and 236-2 in stack structure 220 may be removed to form a plurality of lateral recesses. The etching of first dielectric layers 236-1 and 236-2 may include an isotropic etching process, e.g., wet etch. A conductor material may then be deposited to fill in the lateral recesses, forming a plurality of conductor layers 214 in stack structure 220. Second dielectric layers 246-1 and 246-2 in may be depicted as dielectric layers 224. Conductor layers 214 and dielectric layers 224 in stack structure 220 may form an alternating conductor/dielectric stack. Accordingly, first dielectric deck 220-1 may form a first memory deck, and second dielectric deck 220-2 may form a second memory deck. In some embodiments, the conductor material is deposited by at least one of CVD, PVD, and ALD. Optionally, etch mask 250-3 may be removed.

Referring back to FIG. 3C, after the formation of the conductor layers, a source structure is formed in each slit opening (Operation 328). FIG. 2K illustrates a corresponding structure.

As shown in FIG. 2K, source structure 218 may be formed in slit opening 234. Source structure 218 may include an insulating spacer 218-1 in slit opening 234 and a source contact 218-2 in insulating spacer 218-1. In some embodiments, a doped region 219 is formed in substrate 202 at the bottom of slit opening 234. In some embodiments, source contact 218-2 is in contact with and conductively connected with doped region 219. Source structure 218 may be formed by the joint connection of source portions in adjacent memory decks (e.g., first and second memory decks). Following the shape of slit opening 234, source structure 218 may have a staggered portion at the interface of adjacent memory decks (e.g., the first and second memory decks). In some embodiments, insulating spacer 218-1 includes silicon oxide and source contacts 218-2 include one or more of tungsten, polysilicon, silicides, doped silicon, aluminum, cobalt, and copper. Insulating spacer 218-1 may each be deposited by one or more of CVD, PVD, and ALD, and source contacts 218-2 may each be deposited by one or more of CVD, PVD, ALD, and electroplating. Doped region 219 may be formed by ion implantation. Optionally, a planarization process, e.g., CMP and/or recess etch, is performed to remove any excess material (e.g., the materials for forming source structure 218) over stack structure 220.

In some embodiments, a 3D memory device includes a substrate and a stack structure in an insulating structure on the substrate. The stack structure includes alternating a plurality of conductor layers and a plurality of insulating layers. The 3D memory device further includes a source structure extending vertically through the alternating stack structure. The source structure includes at least one staggered portion along a respective sidewall. The 3D memory device further includes a channel structure and a support pillar each extending vertically through the alternating stack structure and a plurality of contact structures extending vertically through the insulating structure.

In some embodiments, the plurality of contact structures each includes at least one staggered portion along a respective sidewall. The at least one staggered portion of the source structure and the at least one staggered portion of the respective contact structure is at same vertical elevation.

In some embodiments, the plurality of contact structures include a staircase contact structure in contact with one of the plurality of conductor layers and a peripheral contact structure in contact with the substrate.

In some embodiments, a lateral dimension of the support pillar is less than or equal to a lateral dimension of the channel structure.

In some embodiments, a method for forming a 3D memory device includes the following operations. First, on a substrate, a first dielectric deck is formed in an insulating portion. The first dielectric deck has a plurality of dielectric layer pairs, each of the plurality of dielectric layer pairs having a first dielectric layer and a second dielectric layer different from the first dielectric layer. A first pillar hole portion and a first slit opening portion are formed each extending vertically through the first dielectric deck. A pillar-sacrificial portion and a slit-sacrificial portion are formed respectively in the first pillar hole portion and the first slit opening portion. On the first dielectric deck, a second dielectric deck is formed in another insulating portion. The second dielectric deck has another plurality of dielectric layer pairs, each of the other plurality of dielectric layer pairs having another first dielectric layer and another second dielectric layer different from the other first dielectric layer. A second pillar hole portion and a second slit opening portion are formed each extending vertically through the second dielectric deck. The second pillar hole portion exposes the pillar-sacrificial portion and the second slit opening portion exposes the slit-sacrificial portion. Further, the pillar-sacrificial portion is removed, the second pillar hole portion and the first pillar hole portion forming a pillar hole. A support pillar is formed in the pillar hole. The slit-sacrificial portion is removed, the first slit opening portion and the second slit opening portion forming a slit opening. Further, a source structure is formed in the slit opening.

In some embodiments, the method further includes the following operations. First, in a same process, the first pillar hole portion, the first slit opening portion, and a first channel hole portion extending vertically through the first dielectric deck are formed. In a same process, the pillar-sacrificial portion, the slit-sacrificial portion, and a channel-sacrificial portion in the first channel hole portion are formed. In a same process, the second pillar hole portion, the second slit opening portion, and a second channel hole portion extending vertically through the second dielectric deck are formed. The second channel hole portion expose the channel-sacrificial portion. In a same process, the channel-sacrificial portion and the pillar-sacrificial portion are removed. The second channel hole portion and the first channel hole portion form a channel hole. In a same process, a channel structure in the channel hole and the support pillar in the pillar hole are formed.

In some embodiments, the method further includes forming, in a same process, another slit-sacrificial portion in the second slit opening portion to be in contact with the slit-sacrificial portion, another channel-sacrificial portion in the second channel hole portion to be in contact with the channel-sacrificial portion, and another pillar-sacrificial portion in the second pillar hole portion to in contact with the pillar-sacrificial portion. In some embodiments, the method further includes removing the other channel-sacrificial portion and the other pillar-sacrificial portion in the same process that removes the channel-sacrificial portion and the pillar-sacrificial portion, forming the channel hole and the pillar hole. In some embodiments, the method also includes removing the other slit-sacrificial portion in the same process that removes the slit-sacrificial portion.

In some embodiments, forming the channel-sacrificial portion, the pillar-sacrificial portion, and the slit-sacrificial portion include depositing a conductive material to fill in the first channel hole portion, the first pillar hole portion, and the first slit opening portion in a same deposition process. In some embodiments, forming the other channel-sacrificial portion, the other pillar-sacrificial portion, and the other slit-sacrificial portion include depositing another conductive material to fill in the second channel hole portion, the second pillar hole portion, and the second slit opening portion in a same deposition process.

In some embodiments, the method further includes forming an etch mask that covers the other slit-sacrificial portion and the slit-sacrificial portion during the removal of the channel-sacrificial portion, the other channel-sacrificial portion, the pillar-sacrificial portion, and the other pillar-sacrificial portion.

In some embodiments, the method further includes forming a conductive plug structure in contact with the substrate in the first channel hole portion after a formation of the first channel hole portion and before a formation of the first slit opening portion and a formation of the first pillar hole portion.

In some embodiments, the method further includes forming a first staircase contact opening portion and a first peripheral contact opening portion each vertically extending through the insulating portion in a same process that forms the first slit opening portion and the first pillar hole portion.

In some embodiments, the method further includes depositing the conductive material to fill in the first staircase contact opening portion and the first peripheral contact opening portion in the same deposition process that fills in the first channel hole portion, the first pillar hole portion, and the first slit opening portion to form a staircase contact portion in the first contact opening portion and a peripheral contact portion in the first peripheral contact opening portion.

In some embodiments, the method further includes forming the second dielectric deck to cover the staircase contact portion and the first peripheral contact portion.

In some embodiments, the method further includes forming, by the same process that forms the second channel hole portion, the second pillar hole portion, and the second slit opening portion, a second staircase contact opening portion and a second peripheral contact opening portion each extending vertically through the other insulating portion surrounding the second dielectric deck. The second staircase contact opening portion exposes the staircase contact portion and the second peripheral contact opening portion exposes the first peripheral contact portion.

In some embodiments, the method further includes depositing, by the same process that fills in the second channel hole portion, the second pillar hole portion, and the second slit opening portion, the other conductive material to fill in the second staircase contact opening portion and the second peripheral contact opening portion. Another staircase contact portion is formed in the second staircase contact opening portion and in contact with the staircase contact portion. A second peripheral contact portion is formed in the second peripheral contact opening portion and in contact with the first peripheral contact portion.

In some embodiments, forming the channel structure and the support pillar include filling the channel hole and the pillar hole with a channel-forming structure by the same process.

In some embodiments, the method further includes forming another etch mask that covers the other staircase contact portion, the staircase contact portion, the other peripheral contact portion, and the peripheral contact portion during (i) the removal of the other pillar-sacrificial portion, the pillar-sacrificial portion, the other channel-sacrificial portion, and the channel-sacrificial portion, (ii) a formation of the channel structure and the support pillar, and (iii) a formation of the slit opening.

In some embodiments, before a formation of the source structure, the method further includes removing the second dielectric layers in the first dielectric deck and the other second dielectric layers in the second dielectric deck through the slit opening to form a plurality of lateral recesses, and depositing a conductor material through the slit opening to form a plurality of conductor layers in the plurality of lateral recesses.

In some embodiments, a method for forming a 3D memory device includes the following operations. First, on a substrate, a first dielectric deck is formed in an insulating portion, the first dielectric deck having a plurality of dielectric layer pairs, each of the plurality of dielectric layer pairs having a first dielectric layer and a second dielectric layer different from the first dielectric layer. A first slit opening portion is formed extending vertically through the first dielectric deck, and a first contact opening portion is formed extending through the insulating portion. A slit-sacrificial portion is then formed in the first slit opening portion and a contact portion is then formed in the first contact opening portion. Further, on the first dielectric deck, a second dielectric deck is formed in another insulating portion. The second dielectric deck include another plurality of dielectric layer pairs, each of the other plurality of dielectric layer pairs having another first dielectric layer and another second dielectric layer different from the other first dielectric layer. A second slit opening portion is then formed extending vertically through the second dielectric deck and a second contact opening portion is then formed extending through the other insulating portion. The second slit opening portion exposes the slit-sacrificial portion and the second contact opening portion exposes the contact portion. The slit-sacrificial portion is then removed. The first slit opening portion and the second slit opening portion form a slit opening. A source structure is then formed in the slit opening.

In some embodiments, forming the first contact opening portion incudes forming a first staircase contact opening portion extending in the insulating portion and exposing a respective first dielectric layer, and forming a first peripheral contact opening portion extending through the insulating portion and exposing the substrate. In some embodiments, forming the contact portion includes forming a staircase contact portion in the first staircase contact opening portion and a peripheral contact portion in the first peripheral contact opening portion. In some embodiments, forming the second contact opening portion includes forming a second staircase contact opening portion extending through the other insulating portion and exposing the respective staircase contact portion, and forming a second peripheral contact opening portion extending through the other insulating portion and exposing the peripheral contact portion.

In some embodiments, the method further includes forming, in a same process, another slit-sacrificial portion in the second slit opening portion to be in contact with the slit-sacrificial portion, another staircase contact portion in the second staircase opening portion and in contact with the staircase contact portion, and another peripheral contact portion in the second peripheral contact opening portion and in contact with the peripheral contact portion. In some embodiments, the method further includes removing the other slit-sacrificial portion in the same process that removes the slit-sacrificial portion.

In some embodiments, forming the staircase contact portion, the peripheral contact portion, and the slit-sacrificial portion include depositing a conductive material to fill in the first staircase contact opening portion, the first peripheral contact opening portion, and the first slit opening portion in a same deposition process. In some embodiments, forming the other staircase contact portion, the other peripheral contact portion, and the other slit-sacrificial portion include depositing another conductive material to fill in the second staircase contact opening portion, the second peripheral contact opening portion, and the second slit opening portion in a same deposition process.

In some embodiments, the method further includes forming an etch mask that covers the other staircase contact portion, the staircase contact portion, the other peripheral contact portion, and the peripheral contact portion during the removal of the slit-sacrificial portion and the other slit-sacrificial portion.

In some embodiments, before a formation of the source structure, the method further includes, removing, through the slit opening, the second dielectric layers the first dielectric deck and the other second dielectric layers in the second dielectric deck to form a plurality of lateral recesses. In some embodiments, before a formation of the source structure, the method further includes, depositing, through the slit opening, a conductor material to form a plurality of conductor layers in the plurality of lateral recesses.

In some embodiments, the method further includes forming a first channel hole portion extending vertically along the first dielectric deck before a formation of the first staircase contact opening portion and the first peripheral contact opening portion, and forming a first pillar hole portion extending vertically along the first dielectric deck in a same process that forms the first staircase contact opening portion, the first peripheral contact opening portion, and the first slit opening portion.

In some embodiments, the method further includes forming a conductive plug structure in contact with the substrate in the first channel hole portion after a formation of the first channel hole portion and before a formation of the first staircase contact opening portion, the first peripheral contact opening portion, and the first slit opening portion.

In some embodiments, the method further includes depositing the conductive material to fill the first channel hole portion and the first pillar hole portion to form a channel-sacrificial portion in the first channel hole portion and a pillar-sacrificial portion in the first pillar hole portion in the same process that forms the staircase contact portion, the peripheral contact portion, and the slit-sacrificial portion. In some embodiments, the method further includes depositing the other conductive material to fill the second channel hole portion and the second pillar hole portion to form another channel-sacrificial portion in the second channel hole portion and another pillar-sacrificial portion in the second pillar hole portion in the same process that forms the other staircase contact portion, the other peripheral contact portion, and the other slit-sacrificial portion.

In some embodiments, the method further includes forming another etch mask that covers the other staircase contact portion, the staircase contact portion, the other peripheral contact portion, the peripheral contact portion, the other slit-sacrificial portion, and the slit-sacrificial portion. In some embodiments, the method further includes removing the other channel-sacrificial portion, the channel-sacrificial portion, the other pillar-sacrificial portion, and the pillar-sacrificial portion. The first channel hole portion and the second channel hole portion form a channel hole, and the first pillar hole portion and the second pillar hole portion form a pillar hole.

In some embodiments, the method further includes, in a same process, filling the channel hole and the pillar hole with a channel-forming structure to respectively form a channel structure and a support pillar.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    forming, on a substrate, a first dielectric deck in an insulating portion, the first dielectric deck comprising a first plurality of dielectric layer pairs, each of the first plurality of dielectric layer pairs comprising a first dielectric layer and a second dielectric layer different from the first dielectric layer;
    forming, concurrently in a same patterning/etching process, a first pillar hole portion, a first slit opening portion, a first staircase contact opening portion and a first peripheral contact opening portion, the first pillar hole portion and the first slit opening portion each extending vertically through the first dielectric deck,
    the first staircase contact opening portion and the first peripheral contact opening portion each vertically extending through the insulating portion, the first peripheral contact opening being formed in a region of the insulating portion away from the first dielectric deck;
    forming a pillar-sacrificial portion and a slit-sacrificial portion respectively in the first pillar hole portion and the first slit opening portion;
    forming, on the first dielectric deck, a second dielectric deck in another insulating portion, the second dielectric deck comprising a second plurality of dielectric layer pairs, each of the second plurality of dielectric layer pairs comprising a third dielectric layer and a fourth dielectric layer different from the third dielectric layer;
    forming a second pillar hole portion and a second slit opening portion each extending vertically through the second dielectric deck, the second pillar hole portion exposing the pillar-sacrificial portion and the second slit opening portion exposing the slit-sacrificial portion;
    removing the pillar-sacrificial portion, the second pillar hole portion and the first pillar hole portion forming a pillar hole;
    forming a support pillar in the pillar hole;
    removing the slit-sacrificial portion, the first slit opening portion and the second slit opening portion forming a slit opening; and
    forming a source structure in the slit opening.

2. The method of claim 1, further comprising:
    forming, during a first etching process, a first channel hole portion extending vertically through the first dielectric deck;
    forming, in a same process, the pillar-sacrificial portion, the slit-sacrificial portion, and a channel-sacrificial portion in the first channel hole portion;
    forming, during a second etching process, a second channel hole portion extending vertically through the second dielectric deck, the second channel hole portion exposing the channel-sacrificial portion;
    removing, in a same process, the channel-sacrificial portion and the pillar-sacrificial portion, the second channel hole portion and the first channel hole portion forming a channel hole; and
    forming, in a same process, a channel structure in the channel hole and the support pillar in the pillar hole.

3. The method of claim 2, further comprising:
    forming, in a same process, another slit-sacrificial portion in the second slit opening portion to be in contact with the slit-sacrificial portion, another channel-sacrificial portion in the second channel hole portion to be in contact with the channel-sacrificial portion, and another pillar-sacrificial portion in the second pillar hole portion to be in contact with the pillar-sacrificial portion;
    removing the other channel-sacrificial portion and the other pillar-sacrificial portion in the same process that removes the channel-sacrificial portion and the pillar-sacrificial portion, forming the channel hole and the pillar hole; and
    removing the other slit-sacrificial portion in the same process that removes the slit-sacrificial portion.

4. The method of claim 3, wherein
    forming the channel-sacrificial portion, the pillar-sacrificial portion, and the slit-sacrificial portion comprise depositing a conductive material to fill in the first channel hole portion, the first pillar hole portion, and the first slit opening portion in a same deposition process; and
    forming the other channel-sacrificial portion, the other pillar-sacrificial portion, and the other slit-sacrificial portion comprise depositing another conductive material to fill in the second channel hole portion, the second pillar hole portion, and the second slit opening portion in a same deposition process.

5. The method of claim 4, further comprising depositing the conductive material to fill in the first staircase contact opening portion and the first peripheral contact opening portion in the same deposition process that fills in the first channel hole portion, the first pillar hole portion, and the first slit opening portion to form a staircase contact portion in a first contact opening portion and a peripheral contact portion in the first peripheral contact opening portion.

6. The method of claim 5, further comprising forming, by the second etching process, the second pillar hole portion, and the second slit opening portion, a second staircase contact opening portion and a second peripheral contact opening portion each extending vertically through the other insulating portion surrounding the second dielectric deck, wherein the second staircase contact opening portion exposes the staircase contact portion and the second peripheral contact opening portion exposes the first peripheral contact opening portion.

7. The method of claim 6, further comprising depositing, by the same process that fills in the second channel hole portion, the second pillar hole portion, and the second slit opening portion, the other conductive material to fill in the second staircase contact opening portion and the second peripheral contact opening portion, forming (i) another staircase contact portion in the second staircase contact opening portion and in contact with the staircase contact portion, and (ii) a second peripheral contact portion in the second peripheral contact opening portion and in contact with the first peripheral contact portion.

8. The method of claim 2, wherein forming the channel structure and the support pillar comprise filling the channel hole and the pillar hole with a channel-forming structure by the same process.

9. A method for forming a three-dimensional (3D) memory device, comprising:
    forming, on a substrate, a first dielectric deck in an insulating portion, the first dielectric deck comprising a first plurality of dielectric layer pairs, each of the first plurality of dielectric layer pairs comprising a first dielectric layer and a second dielectric layer different from the first dielectric layer;

forming, concurrently during a first etching process, a first pillar hole portion, a first slit opening portion, a first staircase contact opening portion and a first peripheral contact opening portion, the first pillar hole portion and the first pillar hole portion each extending vertically through the first dielectric deck, the first staircase contact opening portion extending in the insulating portion and exposing a respective first dielectric layer, and the first peripheral contact opening portion extending through the insulating portion and exposing the substrate in a region of the insulation portion away from the first dielectric deck;

forming a slit-sacrificial portion in the first slit opening portion and a contact portion in the first contact opening portion;

forming, on the first dielectric deck, a second dielectric deck in another insulating portion, the second dielectric deck comprising a second plurality of dielectric layer pairs, each of the second plurality of dielectric layer pairs comprising a third dielectric layer and a fourth dielectric layer different from the third dielectric layer;

forming, concurrently during a second etching processing, a second slit opening portion extending vertically through the second dielectric deck and a second contact opening portion extending through the other insulating portion, the second contact opening portion located outside of the second dielectric deck, and the second slit opening portion exposing the slit-sacrificial portion and the second contact opening portion exposing the contact portion;

removing the slit-sacrificial portion, the first slit opening portion and the second slit opening portion forming a slit opening; and forming a source structure in the slit opening.

10. The method of claim 9, wherein:

forming the contact portion comprises forming a staircase contact portion in the first staircase contact opening portion and a peripheral contact portion in the first peripheral contact opening portion; and forming the second contact opening portion comprises forming a second staircase contact opening portion extending through the other insulating portion and exposing the respective staircase contact portion, and forming a second peripheral contact opening portion extending through the other insulating portion and exposing the peripheral contact portion.

11. The method of claim 10, further comprising:

forming, in a same process, another slit-sacrificial portion in the second slit opening portion to be in contact with the slit-sacrificial portion, another staircase contact portion in the second staircase contact opening portion and in contact with the staircase contact portion, and another peripheral contact portion in the second peripheral contact opening portion and in contact with the peripheral contact portion; and removing the other slit-sacrificial portion in the same process that removes the slit-sacrificial portion.

12. The method of claim 11, wherein forming the staircase contact portion, the peripheral contact portion, and the slit-sacrificial portion comprise depositing a conductive material to fill in the first staircase contact opening portion, the first peripheral contact opening portion, and the first slit opening portion in a same deposition process; and forming the other staircase contact portion, the other peripheral contact portion, and the other slit-sacrificial portion comprise depositing another conductive material to fill in the second staircase contact opening portion, the second peripheral contact opening portion, and the second slit opening portion in a same deposition process.

13. The method of claim 10, further comprising:

forming a first channel hole portion extending vertically along the first dielectric deck before a formation of the first staircase contact opening portion and the first peripheral contact opening portion.

14. The method of claim 13, further comprising:

forming a conductive plug structure in contact with the substrate in the first channel hole portion after a formation of the first channel hole portion and before a formation of the first staircase contact opening portion, the first peripheral contact opening portion, and the first slit opening portion;

depositing a conductive material to fill the first channel hole portion and the first pillar hole portion to form a channel-sacrificial portion in the first channel hole portion and a pillar-sacrificial portion in the first pillar hole portion in the same process that forms the staircase contact portion, the peripheral contact portion, and the slit-sacrificial portion; and depositing the other conductive material to fill a second channel hole portion and a second pillar hole portion to form another channel-sacrificial portion in the second channel hole portion and another pillar-sacrificial portion in the second pillar hole portion in the same process that forms the other staircase contact portion, the other peripheral contact portion, and the other slit-sacrificial portion.

15. The method of claim 14, further comprising:

forming another etch mask that covers the other staircase contact portion, the staircase contact portion, the other peripheral contact portion, the peripheral contact portion, the other slit-sacrificial portion, and the slit-sacrificial portion;

removing the other channel-sacrificial portion, the channel-sacrificial portion, the other pillar-sacrificial portion, and the pillar-sacrificial portion, wherein the first channel hole portion and the second channel hole portion form a channel hole, and the first pillar hole portion and the second pillar hole portion form a pillar hole; and in a same process, filling the channel hole and the pillar hole with a channel-forming structure to respectively form a channel structure and a support pillar.

* * * * *